United States Patent
Yeh et al.

(10) Patent No.: US 9,286,986 B2
(45) Date of Patent: Mar. 15, 2016

(54) DATA WRITING METHOD, AND MEMORY CONTROL CIRCUIT UNIT AND MEMORY STORAGE APPARATUS USING THE SAME

(71) Applicant: PHISON ELECTRONICS CORP., Miaoli (TW)

(72) Inventors: Chih-Kang Yeh, Kinmen County (TW); Wei Lin, Taipei (TW)

(73) Assignee: PHISON ELECTRONICS CORP., Miaoli (TW)

(*) Notice: Subject to any disclaimer, the term of this patent is extended or adjusted under 35 U.S.C. 154(b) by 0 days.

(21) Appl. No.: 14/257,010

(22) Filed: Apr. 21, 2014

(65) Prior Publication Data

US 2014/0226412 A1 Aug. 14, 2014

Related U.S. Application Data

(63) Continuation-in-part of application No. 13/653,424, filed on Oct. 17, 2012, now Pat. No. 8,737,126.

(51) Int. Cl.

| | |
|---|---|
| *G11C 16/10* | (2006.01) |
| *G11C 11/56* | (2006.01) |
| *G11C 16/04* | (2006.01) |
| *G11C 16/34* | (2006.01) |
| *G11C 7/04* | (2006.01) |
| *G11C 29/02* | (2006.01) |
| *G11C 7/10* | (2006.01) |

(52) U.S. Cl.
CPC *G11C 16/10* (2013.01); *G11C 7/04* (2013.01); *G11C 11/5628* (2013.01); *G11C 11/5671* (2013.01); *G11C 16/0466* (2013.01); *G11C 16/349* (2013.01); *G11C 16/3418* (2013.01); *G11C 16/3468* (2013.01); *G11C 16/3495* (2013.01); *G11C 29/028* (2013.01); *G11C 7/1006* (2013.01); *G11C 2211/5621* (2013.01)

(58) Field of Classification Search
CPC ......... G11C 16/06; G11C 16/10; G06F 12/02
USPC ............ 365/185.25, 185.18, 185.03; 711/103
See application file for complete search history.

(56) References Cited

U.S. PATENT DOCUMENTS

| | | | | |
|---|---|---|---|---|
| 8,009,472 | B2 * | 8/2011 | Murin et al. | 365/185.03 |
| 2010/0115192 | A1 | 5/2010 | Lee | 711/103 |
| 2010/0329034 | A1 * | 12/2010 | Bryant-Rich | 365/185.25 |
| 2011/0314204 | A1 * | 12/2011 | Ootsuka et al. | 711/103 |

* cited by examiner

*Primary Examiner* — Hoai V Ho
*Assistant Examiner* — Muna A Techane
(74) *Attorney, Agent, or Firm* — Jianq Chyun IP Office

(57) ABSTRACT

A data writing method for writing data into a memory cell of a rewritable non-volatile memory module, and a memory control circuit unit and a memory storage apparatus using the same area provided. The method includes recording a wear degree of the memory cell and detecting an operating temperature of the memory storage apparatus. The method further includes adjusting at least one predetermined operation parameter corresponding to the rewritable non-volatile memory module to generate at least one adjusted operation parameter corresponding to the rewritable non-volatile memory module and writing the data into the memory cell based on the at least one adjusted operation parameter if the operating temperature of the memory storage apparatus is larger than a predetermined temperature. Accordingly, the method can accurately store data into the rewritable non-volatile memory module, thereby lowing the operating temperature of the memory storage apparatus.

24 Claims, 22 Drawing Sheets

DATA WRITING METHOD, AND MEMORY CONTROL CIRCUIT UNIT AND MEMORY STORAGE APPARATUS USING THE SAME

CROSS-REFERENCE TO RELATED APPLICATION

This application is a continuation-in-part application of and claims the priority benefit of a prior application Ser. No. 13/653,424, filed on Oct. 17, 2012. The prior application Ser. No. 13/653,424 claims the priority benefit of Taiwan application serial no. 101129226, filed on Aug. 13, 2012. The entirety of each of the above-mentioned patent applications is hereby incorporated by reference herein and made a part of this specification.

BACKGROUND

1. Technology Field

The present invention is directed to a data writing method for a rewritable non-volatile memory module, and a memory control circuit unit and a memory storage apparatus using the method.

2. Description of Related Art

Along with the widespread of digital cameras, cell phones, and MP3 in recently years, the consumers' demand for storage media has increased drastically. Since a rewritable non-volatile memory has the characteristics of non-volatility of data, low power consumption, small volume, non-mechanical structure, and fast reading and writing speed, the rewritable non-volatile memory is the most adaptable memory applied in a portable electronic product, e.g., a notebook computer. A solid state drive (SSD) is a storage apparatus which utilizes a flash memory as its storage medium. Therefore, the flash memory industry has become a very popular part of the electronic industry in recent years.

FIG. 1 is a schematic diagram illustrating a flash memory device according to the related art.

Referring to FIG. 1, a flash memory device 1 includes a charge-trapping layer 2 for storing electrons, a control gate 3 for applying a bias voltage, a tunnel oxide layer 4 and an interpoly dielectric layer 5. When data is about to be written to the flash memory device 1, a threshold voltage of the flash memory device 1 may be changed by injecting electrons into the charge-trapping layer 2. Accordingly, a digital level state of the flash memory device 1 is defined to implement a function of storing data. Here, the process of injecting the electrons to the charge-trapping layer 2 is referred to as programming. Otherwise, when the data is about to be removed, the flash memory device 1 is restored to the unprogrammed state by removing the injected electrons from the charge-trapping layer 2.

During operations of writing and erasing, the flash memory device 1 would be worn due to frequently injecting and removing the electrons, which leads to the increased speed of writing the electrons and wider distribution of the threshold voltage. As a result, after being programmed, the storage state of the flash memory device 1 can not be accurately identified, which results in the occurrence of error bits. In particular, in a case that the flash memory device 1 is at a high temperature, the data retention of the flash memory device 1 is decreased, and thereby the occurrence of error bits becomes more serious.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention is directed to a data writing method applicable to effectively reducing the occurrence of error bits.

The present invention is directed to a memory control circuit unit capable of effectively reducing the occurrence of error bits.

The present invention is directed to a memory storage apparatus capable of effectively reducing the occurrence of error bits.

According to an exemplary embodiment of the present invention, a data writing method for writing data to a memory cell of a rewritable non-volatile memory module of a memory storage apparatus is provided. The data writing method includes detecting an operating temperature of the memory storage apparatus and determining whether the operating temperature of the memory storage apparatus is larger than a predetermined temperature. The data writing method further includes adjusting at least one predetermined operation parameter corresponding to the rewritable non-volatile memory module to generate at least one adjusted operation parameter corresponding to the rewritable non-volatile memory module and writing the data into the memory cell based on the at least one adjusted operation parameter if the operating temperature of the memory storage apparatus is larger than the predetermined temperature.

According to an exemplary embodiment of the present invention, a memory control circuit unit configured to write data to a memory cell of a rewritable non-volatile memory module is provided. The memory control circuit unit includes a host interface, a memory interface, a memory management circuit and a thermal sensor. The host interface is configured to be coupled to a host system. The memory interface is configured to be coupled to the rewritable non-volatile memory module. The thermal sensor is coupled to the memory management circuit and configured to detect an operating temperature of the memory storage apparatus. The memory management circuit is coupled to the host interface and the memory interface. The memory management circuit is configured to determine whether the operating temperature of the memory storage apparatus is larger than a predetermined temperature, and if the operating temperature of the memory storage apparatus is larger than the predetermined temperature, adjust at least one predetermined operation parameter corresponding to the rewritable non-volatile memory module to generate at least one adjusted operation parameter corresponding to the rewritable non-volatile memory module and gives a command sequence for writing the data into the memory cell based on the at least one adjusted operation parameter to the rewritable non-volatile memory module.

According to an exemplary embodiment of the present invention, a memory storage apparatus including a connection interface unit, a rewritable non-volatile memory module and a memory control circuit unit is provided. The connection interface unit is configured to be coupled to a host system. The memory control circuit unit is coupled to the connection interface unit and the rewritable non-volatile memory module. The memory control circuit unit is configured to detect an operating temperature of the memory storage apparatus, and determine whether the operating temperature is larger than a predetermined temperature. The memory control circuit unit is further configured to adjust at least one predetermined operation parameter corresponding to the rewritable non-volatile memory module to generate at least one adjusted operation parameter corresponding to the rewritable non-volatile memory module and write data into the memory cell based on the at least one adjusted operation parameter to the rewritable non-volatile memory module if the operating temperature of the memory storage apparatus is larger than the predetermined temperature.

To sum up, in the data writing method, the memory control circuit unit and the memory storage apparatus according to the embodiments of the present invention, at least one operation parameter corresponding to the rewritable non-volatile memory module can be adjusted based on the operating temperature of the memory storage apparatus so as to accurately write data to the memory cell and reduce the operating temperature of the memory storage apparatus.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
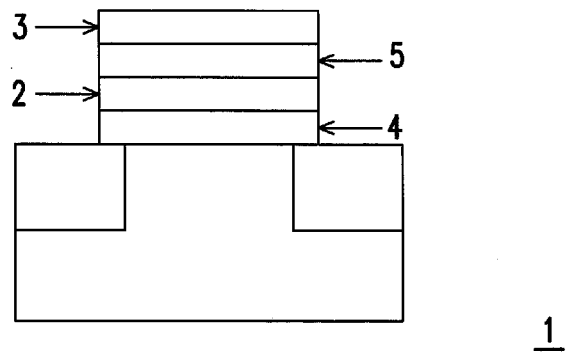
FIG. 1 is a schematic diagram illustrating a flash memory device according to the related art.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Figure 2:
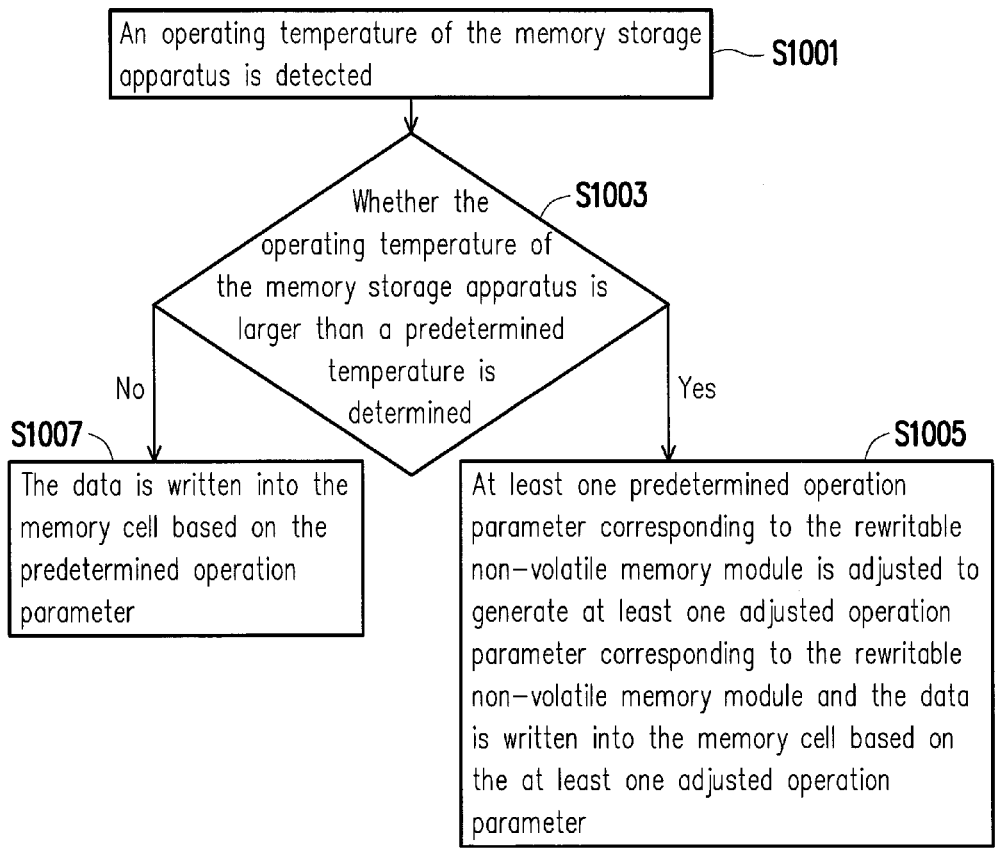
FIG. 2 is a flowchart illustrating a data writing method according to an exemplary embodiment of the present invention.

In order to accurately write data to a rewritable non-volatile memory module and reduce an operating temperature of a memory storage apparatus, as shown in FIG. 2, in an exemplary embodiment, an operating temperature of the memory storage apparatus is detected (Step S1001); whether the operating temperature of the memory storage apparatus is larger than a predetermined temperature is determined (S1003); if the operating temperature of the memory storage apparatus is larger than the predetermined temperature, at least one predetermined operation parameter corresponding to the rewritable non-volatile memory module is adjusted to generate at least one adjusted operation parameter corresponding to the rewritable non-volatile memory module and the data is written into the memory cell based on the at least one adjusted operation parameter (S1005); and if the operating temperature of the memory storage apparatus is not larger than the predetermined temperature, the data is written into the memory cell based on the predetermined operation parameter (S1007). For example, the predetermined temperature may be set to 40° C., 45° C., 50° C., 55° C., 60° C., 65° C., 70° C. and so on. It should be noted that the predetermined temperature may be set based on the type of the rewritable non-volatile memory module and the present invention is not limited thereto. In order to make the aforementioned and other features and advantages of the present invention more comprehensible, several embodiments accompanied with figures are described in detail below.

First Exemplary Embodiment

A memory storage apparatus (i.e., a memory storage system) typically includes a rewritable non-volatile memory module and a controller (i.e., a control circuit). The memory storage apparatus is usually used together with a host system, such that the host system can write data into or read data from the memory storage apparatus.

Figure 3:
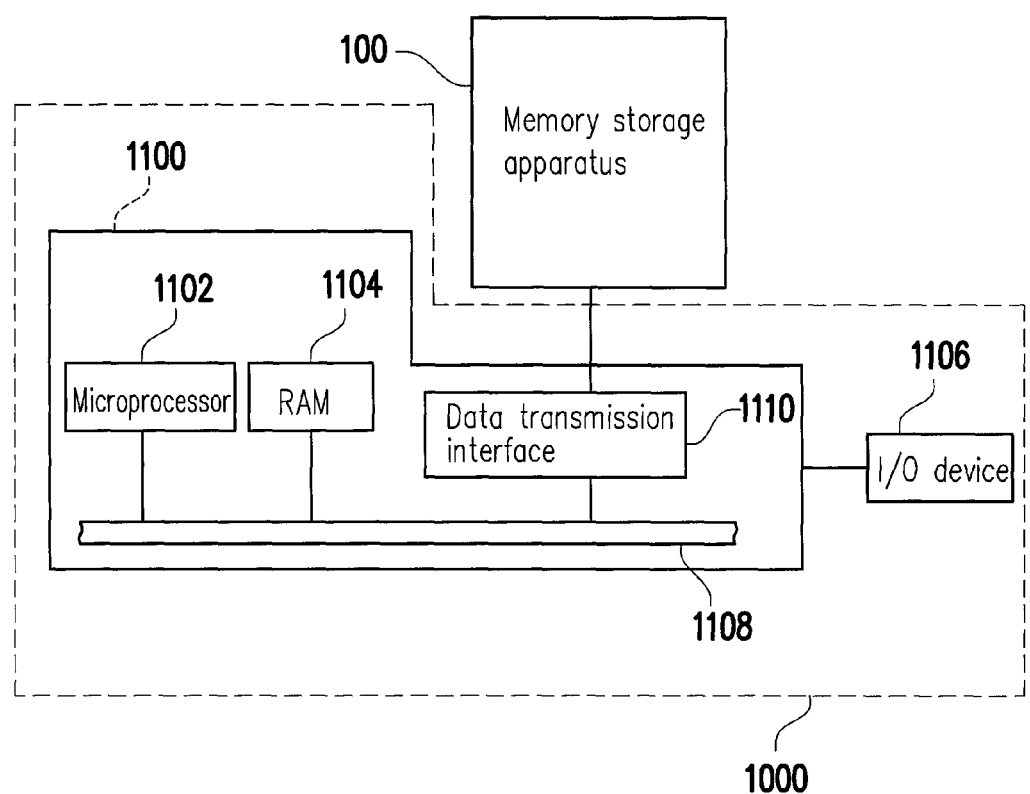
FIG. 3 illustrates a host system and a memory storage apparatus according to a first exemplary embodiment of the present invention.

FIG. 3 illustrates a host system and a memory storage apparatus according to a first exemplary embodiment of the present invention.

Figure 4:
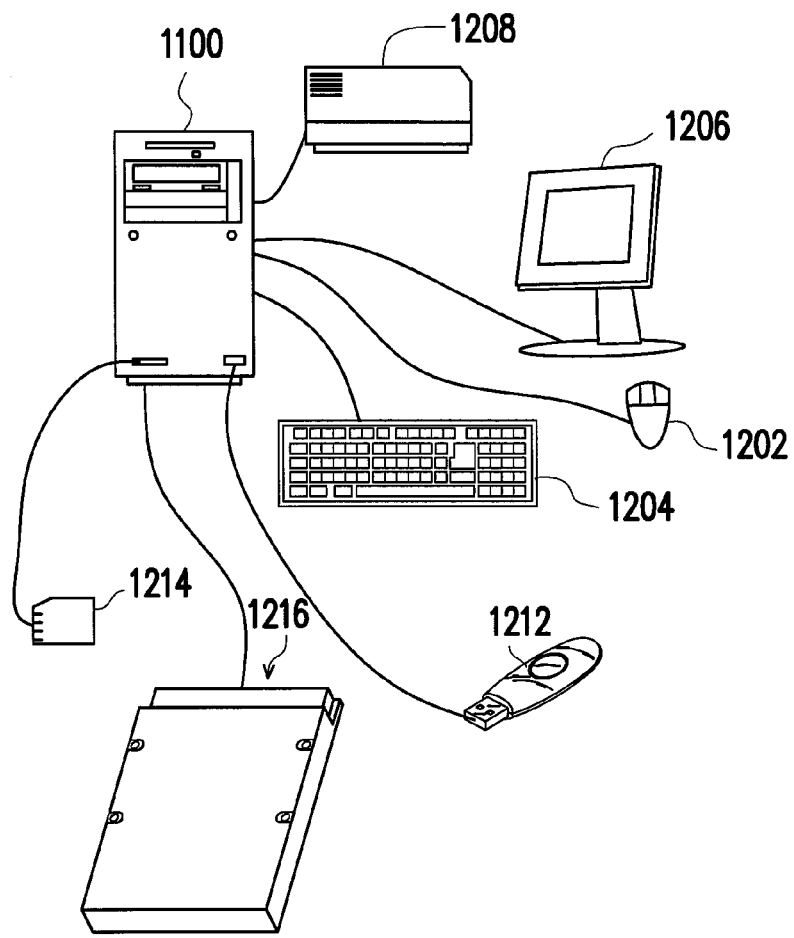
FIG. 4 is a schematic diagram illustrating a computer, an input/output (I/O) device and a memory storage apparatus according to an exemplary embodiment of the present invention.

Referring to FIG. 3, a host system 1000 includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206, and a printer 1208 as shown in FIG. 4. It should be understood that the I/O device 1106 is not limited to the devices illustrated in FIG. 4 and may further include other devices.

In the exemplary embodiment of the present invention, the memory storage apparatus 100 is coupled to other devices of the host system 1000 through the data transmission interface 1110. By operating the microprocessor 1102, the RAM 1104, and the I/O device 1106, the data can be written into or read from the memory storage apparatus 100. For instance, the memory storage apparatus 100 may be a rewritable non-volatile memory storage apparatus, such as a flash drive 1212, a memory card 1214, or a solid state drive (SSD) 1216 as shown in FIG. 4.

Figure 5:
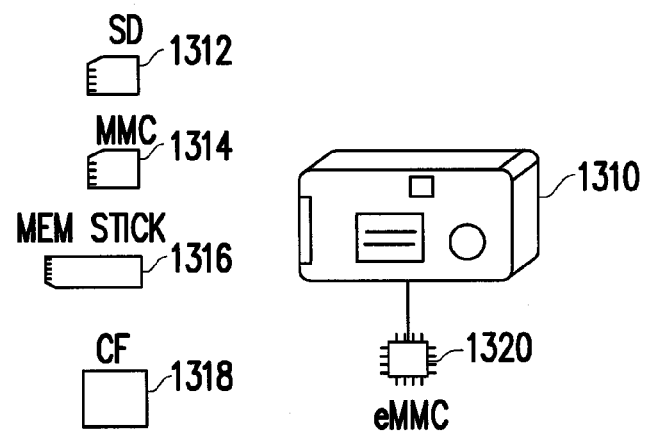
FIG. 5 is a schematic diagram illustrating a host system and a memory storage apparatus according to another exemplary embodiment of the present invention.

Generally, the host system 1000 can substantially be any system operated together with the memory storage apparatus 100 for storing data. Even though the host system 1000 is described as a computer system in the present exemplary embodiment, the host system 1000 in another exemplary embodiment may be a digital camera, a video camera, a communication device, an audio player, a video player, and so forth. For instance, if the host system is a digital camera (video camera) 1310, the rewritable non-volatile memory storage apparatus is an SD card 1312, an MMC 1314, a memory stick 1316, a CF card 1318, or an embedded storage apparatus 1320 (as shown in FIG. 5). The embedded storage device 1320 includes an embedded MMC (eMMC). It should be mentioned that the eMMC is directly coupled to the substrate of the host system.

Figure 6:
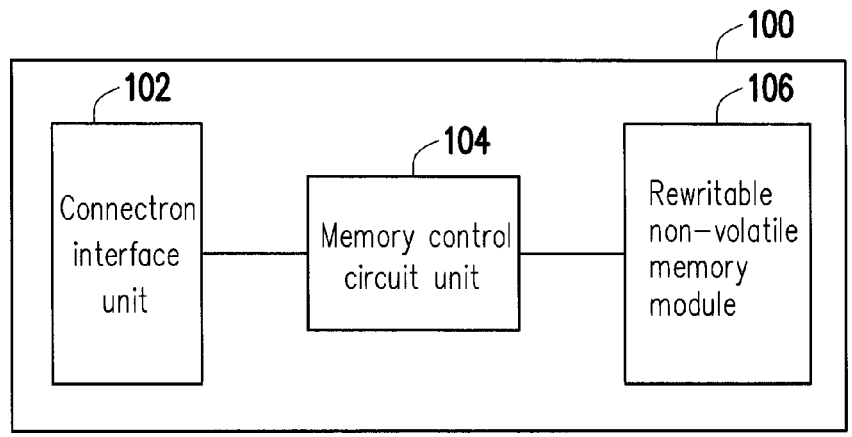
FIG. 6 is a schematic block diagram illustrating the memory storage apparatus according to the first exemplary embodiment of the present invention.

FIG. 6 is a schematic block diagram illustrating the memory storage apparatus according to the first exemplary embodiment of the present invention.

Referring to FIG. 6, the memory storage apparatus 100 includes a connection interface unit 102, a memory control circuit unit 104, and a rewritable non-volatile memory module 106.

In the present exemplary embodiment, the connection interface unit 102 complies with the universal serial bus (USB) standard. However, it should be understood that the present invention is not limited thereto. The connection interface unit 102 may also comply with the parallel advanced technology attachment (PATA) standard, the Institute of Electrical and Electronic Engineers (IEEE) 1394 standard, the peripheral component interconnect (PCI) express standard, the secure digital (SD) interface standard, the serial advanced technology attachment (SATA) standard, the ultra high speed-I (UHS-I) interface standard, the ultra high speed-II (UHS-II) interface standard, the memory stick (MS) interface standard, the multi media card (MMC) standard, the embedded multimedia card (eMMC) interface standard, the universal flash storage (UFS) interface standard, the compact flash (CF) standard, the integrated device electronics (IDE) standard, or other suitable standards.

The memory control circuit unit 104 is configured to execute a plurality of logic gates or control instructions implemented in a form of hardware or firmware and performing various data operations in the rewritable non-volatile memory module 106 according to commands issued by the host system 1000, such as data writing, reading, erasing, merging, and so on.

The rewritable non-volatile memory module 106 is coupled to the memory control circuit unit 104 and configured to store the data written by the host system 1000. In the present exemplary embodiment, the rewritable non-volatile memory module 106 is a multi level cell (MLC) NAND flash memory module (i.e. a flash memory module capable of storing data of 2 bits in a memory cell). However, the invention is not limited thereto. The rewritable non-volatile memory module 106 may also be a single level cell (SLC) NAND flash memory module (i.e. a flash memory module capable of storing data of 1 bit in a memory cell), a trinary level cell (TLC) NAND flash memory module (i.e. a flash memory module capable of storing data of 3 bits in a memory cell), other flash memory module or other memory module having the same characteristic.

Figure 7:
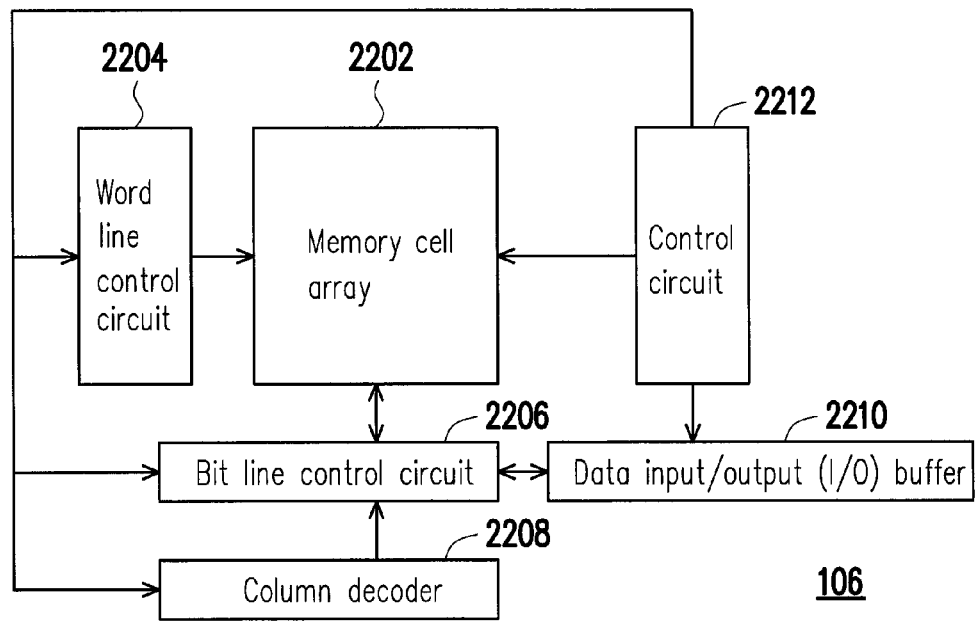
FIG. 7 is a schematic block diagram illustrating a rewritable non-volatile memory module according to the first exemplary embodiment of the present invention.

FIG. 7 is a schematic block diagram illustrating a rewritable non-volatile memory module according to the first exemplary embodiment of the present invention.

Referring to FIG. 7, a rewritable non-volatile memory module 106 includes a memory cell array 2202, a word line control circuit 2204, a bit line control circuit 2206, a column decoder 2208, a data input/output (I/O) buffer 2210 and a control circuit 2212.

The memory cell array 2202 includes a plurality of memory cells for storing data (as shown in FIG. 1), a plurality of bit lines (not shown) for connecting the memory cells, a plurality of word lines and a common source line (not shown). The memory cells are disposed on the cross points of the bit lines and the word lines as an array. When a write command or a read command is received from the memory control circuit unit 130, the control circuit 2212 controls the word line control circuit 2204, the bit line control circuit 2206, the column decoder 2208 and the data input/output (I/O) buffer 2210 to write data into the memory cell array or read data from the memory cell array 202. Therein, the word line control circuit 2204 is configured to control word line voltages applied to the word lines. The bit line control circuit 2206 is configured to control the bit lines. The column decoder 2208 selects the corresponding bit line according to the decoding column address in the command. And, the data I/O buffer 2210 is configured to temporarily store the data.

In the present exemplary embodiment, the rewritable non-volatile memory module 106 is a MLC NAND flash memory module using a plurality of gate voltages for representing a multi-bit data. To be specific, each memory cell of the memory cell array has a plurality of storage states, and the storage states are distinguished by a plurality of threshold voltages.

Figure 8:
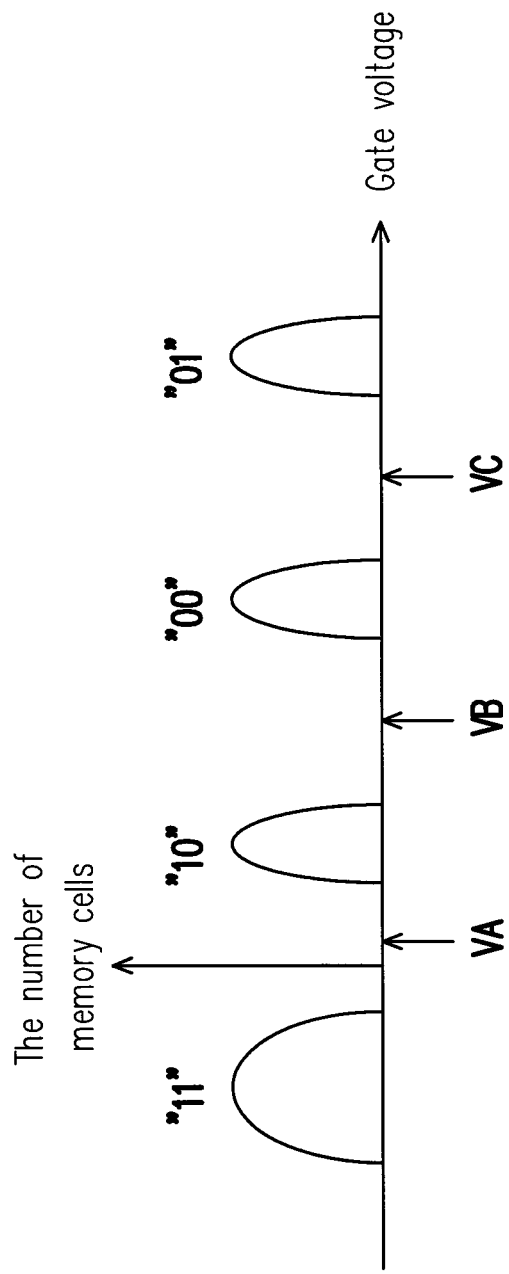
FIG. 8 is a statistical distribution diagram illustrating gate voltages corresponding to data stored in a memory cell array according to the first exemplary embodiment of the present invention.

FIG. 8 is a statistical distribution diagram illustrating gate voltages corresponding to data stored in a memory cell array according to the first exemplary embodiment of the present invention.

Referring to FIG. 8, taking the MLC NAND flash memory for example, the gate voltages in each memory cell can be distinguished into 4 storage states according to a first threshold voltage VA, a second threshold voltage VB, and a third threshold voltage VC, and these storage states respectively represent "11", "10", "00", and "01". In other words, each storage state includes the least significant bit (LSB) and the most significant bit (MSB). In the present exemplary embodiment, the first bit from the left of the storage states (i.e., "11", "10", "00", and "01") is the LSB, and the second bit from the left of the storage states is the MSB. Thus, in the present exemplary embodiment, each memory cell stores data of 2 bits. It should be understood that the embodiment of FIG. 8 illustrating the gate voltages and the corresponding storage states is only an example. In another exemplary embodiment of the invention, the storage states and the corresponding storage states may also have such an arrangement as "11", "10", "01", and "00" along with the increase of the gate voltages. Or, the storage states corresponding to the floating voltages may also be values obtained by mapping or inverting actual storage values. Additionally, in yet anther exemplary embodiment, the first bit from the left may also be defined as the MSB while the second bit from the left as the LSB.

In the present exemplary embodiment, each memory cell stores data of 2 bits. Thus, the memory cells on the same word line constitute a storage space of 2 physical pages (i.e., a lower page and an upper page). Namely, the LSB of each memory cell corresponds to the lower page, and the MSB of each memory cell corresponds to the upper page. Besides, several physical pages in the memory cell array 2202 constitute a physical block, and physical block is the smallest unit for performing the data erasing operation. Namely, each physical block contains the least number of memory cells that are erased together.

To write (or to program) data to a memory cell of the memory cell array 202, the gate voltage in the memory cell is changed by, for example, controlling the gate voltage to change the electron volume in a charge-trapping layer in the gate so that a different storage state is presented. For example, when the lower page data is 1 and the upper page data is also 1, the control circuit 2212 controls the word line control circuit 204 to not change the gate voltage in the memory cell so as to maintain the storage state of the memory cell as "11". When the lower page data is 1 and the upper page data is 0, the control circuit 2212 controls the word line control circuit 2204 to change the gate voltage in the memory cell so as to change the storage state of the memory cell to "10". When the lower page data is 0 and the upper page data is also 0, the control circuit 2212 controls the word line control circuit 2204 to change the gate voltage in the memory cell so as to change the storage state of the memory cell to "00". And, when the lower page data is 0 and the upper page data is 1, the control circuit 2212 controls the word line control circuit 2204 to change the gate voltage in the memory cell so as to change the storage state of the memory cell to "01".

Figure 9:
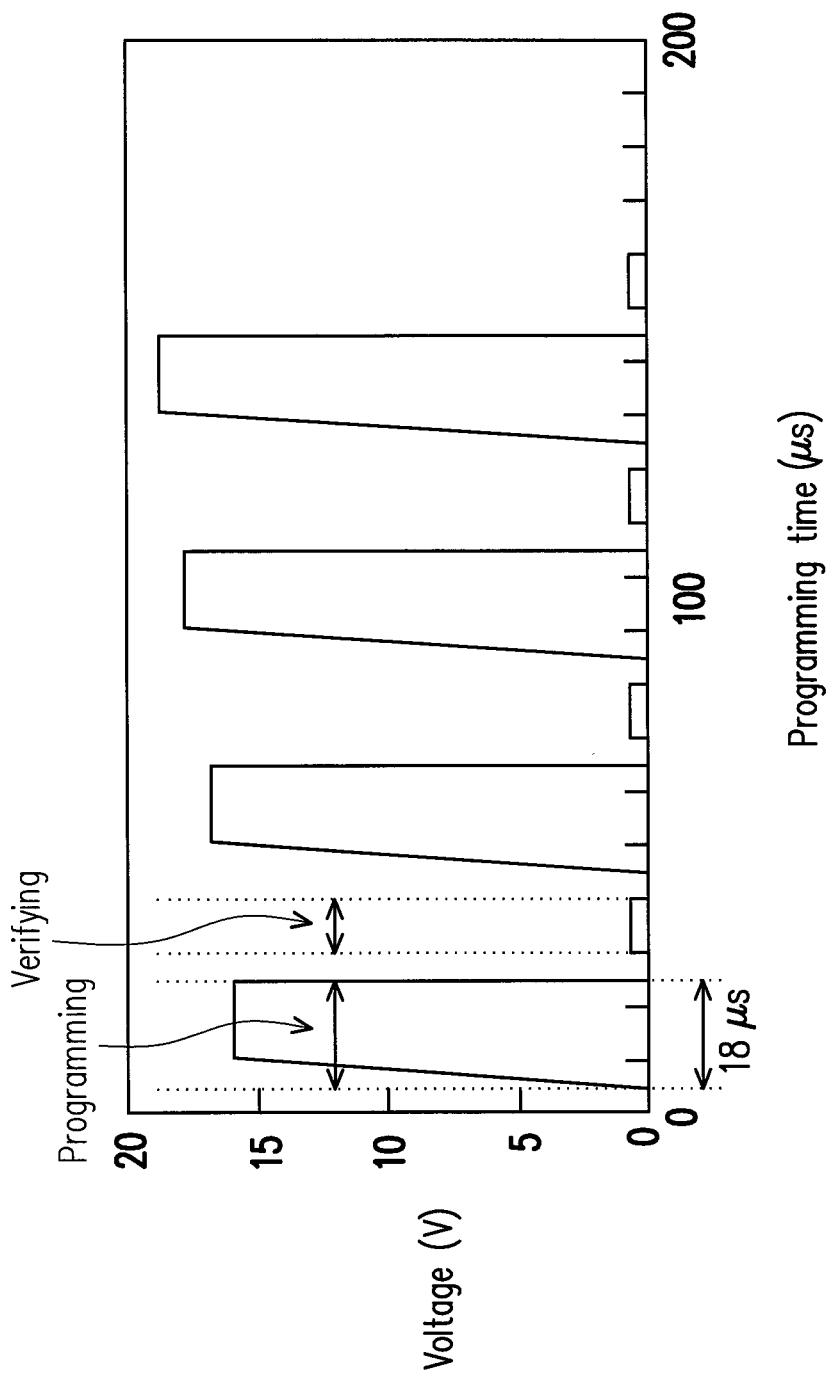
FIG. 9 is a schematic diagram of programming a memory cell according to the first exemplary embodiment of the present invention.

FIG. 9 is a schematic diagram of programming a memory cell according to the first exemplary embodiment of the present invention.

Referring to FIG. 9, in the present exemplary embodiment, the programming of the memory cell is performed by pulse writing/verifying a threshold voltage. Particularly, when data is about to be written to the memory cell, the memory control circuit unit 102 sets an initial write voltage and a write voltage pulse time and then instructs the control circuit 2212 of the rewritable non-volatile memory module 106 to program the memory cell by applying the set initial write voltage and the set write voltage pulse time to perform the data writing operation. Afterward, the memory control circuit unit 102 verifies the memory cell by applying a verify voltage so as to determine whether the memory cell is in an accurate storage state. If the memory cell is not yet programmed to an accurate storage state, the memory control circuit unit 102 instructs the control circuit 2212 to re-program the memory cell according to a new write voltage (also referred to as a re-write voltage) and the write voltage pulse time, wherein the new write voltage is the currently applied write voltage plus a preset compensation value. Otherwise, if the memory cell is programmed to an accurate storage state, it represents that the data is accurately written to the memory cell. For example, the initial write voltage is set to 16 volts (V), the write voltage pulse time is set to 18 microseconds (μs) and the preset compensation value is set to 0.6V, but the invention is not limited thereto. In another exemplary embodiment, the preset compensation value may be increasing or decreasing.

Figure 10:
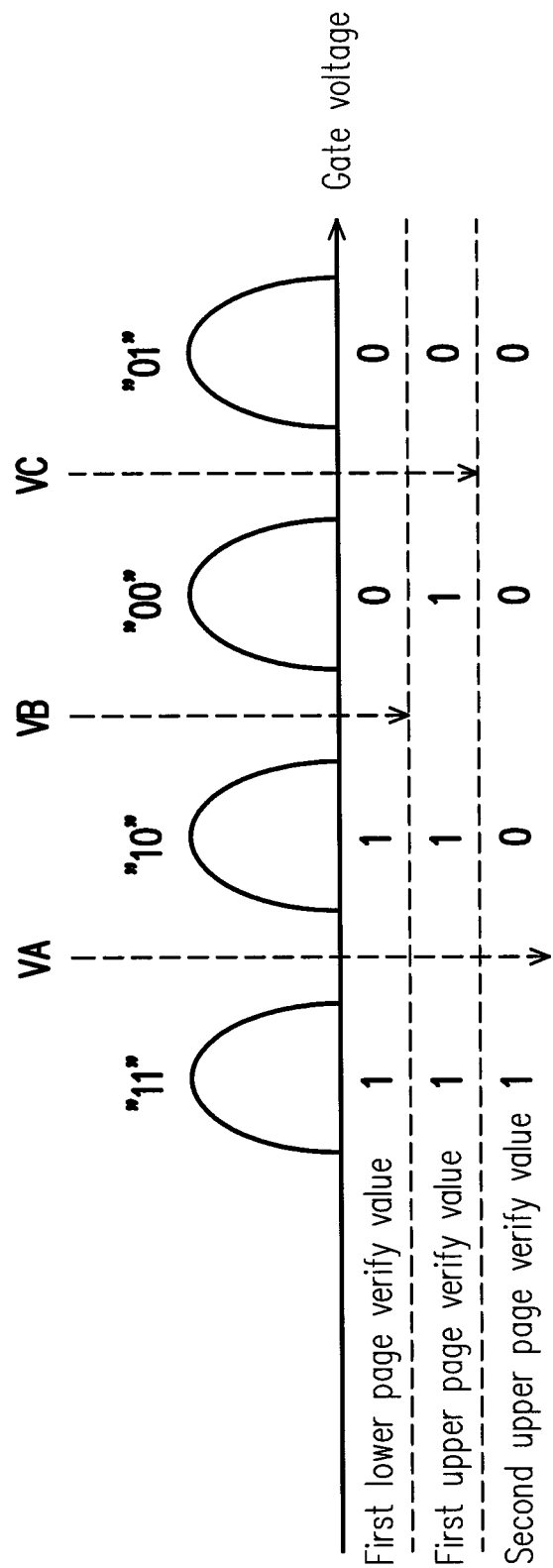
FIG. 10 is a schematic diagram of verifying a storage state of a memory cell according to the first exemplary embodiment of the present invention.

FIG. 10 is a schematic diagram of verifying a storage state of a memory cell according to the first exemplary embodiment of the present invention.

Referring to FIG. 10, to read data from the memory cell of the memory cell array 2202, the gate voltage in the memory cell is distinguished by applying the threshold voltages. In an operation for reading data from a lower page, the word line control circuit 2204 applies the second threshold voltage VB to the memory cell and determines the value of the lower page data according to whether a control gate of the memory cell is turned on and a corresponding expression (1) as follows:

$$LSB = (VB)\text{Lower\_pre1} \quad (1)$$

In foregoing expression (1), (VB)Lower_pre1 represents a first lower page verify value obtained by applying the second threshold voltage VB.

For example, when the second threshold voltage VB is lower than the gate voltage in the memory cell, the control gate of the memory cell is not turned on and a first lower page verify value of '0' is output. Accordingly, the LSB is identified as 0. For example, when the second threshold voltage VB is higher than the gate voltage in the memory cell, the control gate of the memory cell is turned on and a first lower page verify value of '1' is output. Accordingly, the LSB is identified as 1. Namely, the gate voltage for presenting the LSB as value 1 and the gate voltage for presenting the LSB as value 0 can be distinguished by the second threshold voltage VB.

In an operation for reading data from an upper page, the word line control circuit 2204 respectively applies the third threshold voltage VC and the first threshold voltage VA to the memory cell and determines the value of the upper page data according to whether the control gate of the memory cell is turned on and a corresponding expression (2) as follows:

$$MSB = ((VA)\text{Upper\_pre2}) \text{ xor } (\sim(VC)\text{Upper\_pre1}) \quad (2)$$

In foregoing expression (2), (VC)Upper_pre1 represents a first upper page verify value obtained by applying the third threshold voltage VC, and (VA)Upper_pre2 represents a second upper page verify value obtained by applying the first threshold voltage VA, wherein the symbol "~" represents inversion. Additionally, in the present exemplary embodiment, when the third threshold voltage VC is lower than the gate voltage in the memory cell, the control gate of the memory cell is not turned on and a first upper page verify value ((VC)Upper_pre1) of '0' is output. When the first threshold voltage VA is lower than the gate voltage in the memory cell, the control gate of the memory cell is not turned on and a second upper page verify value ((VA)Upper_pre2) of '0' is output.

Thus, in the present exemplary embodiment, according to the expression (2), when both the third threshold voltage VC and the first threshold voltage VA are lower than the gate voltage in the memory cell, the control gate of the memory cell applying the third threshold voltage VC is not turned on and a second upper page verify value of '0' is output. Herein, the MSB is identified as 1.

For example, when the third threshold voltage VC is higher than the gate voltage of the memory cell and the first threshold voltage VA is lower than the gate voltage of the memory cell, the control gate of the memory cell applying the third threshold voltage VC is turned on and a first upper page verify value of '1' is output, while the control gate of the memory cell applying the first threshold voltage VA is not turned on and a second upper page verify value of '0' is output. Herein, the MSB is identified as 0.

For example, when both the third threshold voltage VC and the first threshold voltage VA are higher than the gate voltage of the memory cell, and the third threshold voltage VC is applied, the control gate of the memory cell is turned on and a first upper page verify value of '1' is output, and the control gate of the memory cell applying the first threshold voltage VA is turned on and a second upper page verify value of '1' is output. Herein, the MSB is identified as 1.

It should be understood that even though the present embodiment is described by taking a MLC NAND flash memory for example, the invention is not limited thereto, and data can be read from any other MLC NAND flash memory through the technique described above.

Figure 11:
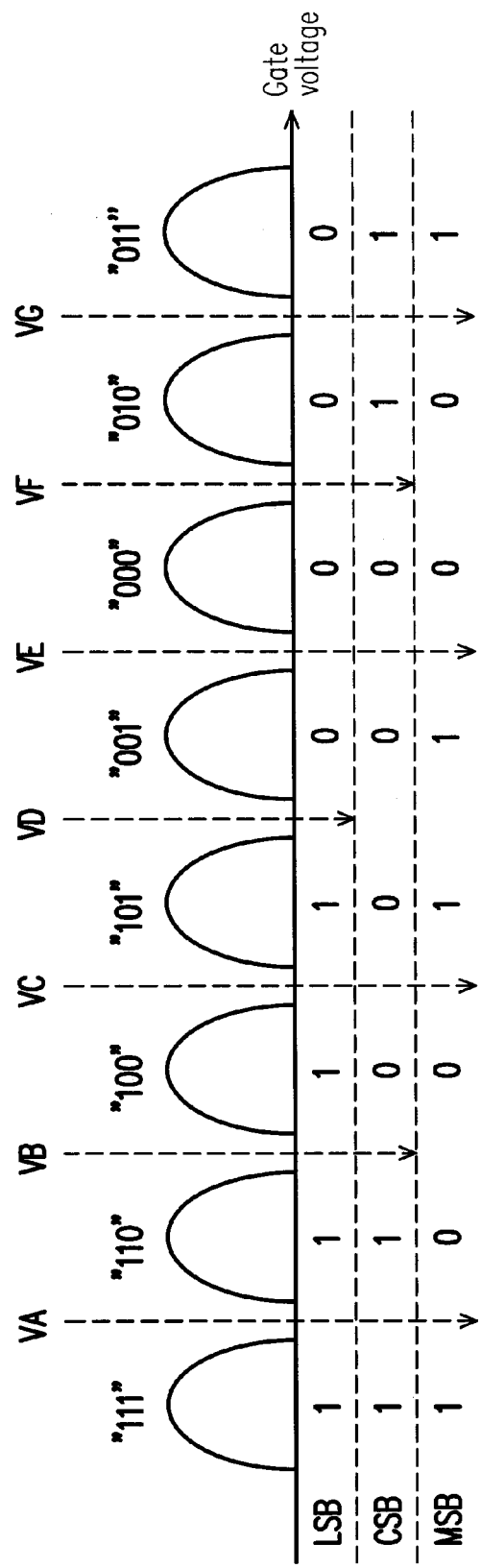
FIG. 11 is a schematic diagram of verifying the storage state of the memory cell according to another exemplary embodiment of the present invention.

For example, taking a TLC NAND flash memory (as shown in FIG. 11) for example, each storage state includes a LSB (the first bit from the left), a center significant bit (CSB, the second bit from the left) and a MSB (the third bit from the left) wherein the LSB corresponds to a lower page, the CSB corresponds to a center page, and the MSB corresponds to an upper page. In this example, the gate voltage in each memory cell is distinguished into 8 storage states (i.e., "111", "110", "100", "101", "001", "000", "010", and "011") according to a first threshold voltage VA, a second threshold voltage VB, a third threshold voltage VC, a fourth threshold voltage VD, a fifth threshold voltage VE, a sixth threshold voltage VF, and a seventh threshold voltage VG. Further, taking a SLC NAND flash memory (not shown) for example, only data of 1 bit is stored in a storage state, and thus, the gate voltage in each memory cell identifies storage states (i.e. "1" and "0") of the memory cell according to a threshold voltage.

Figure 12:
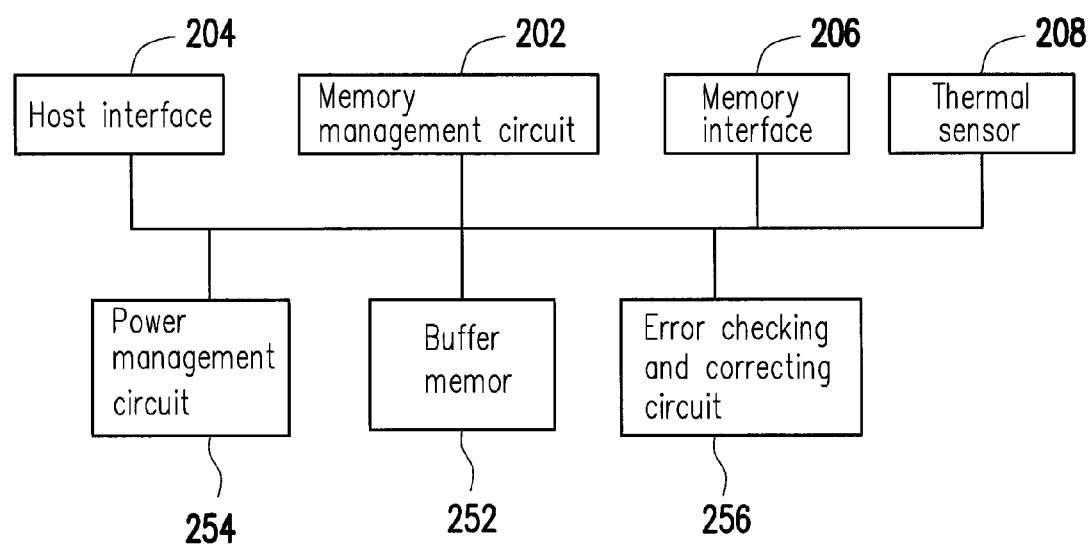
FIG. 12 is a schematic block diagram illustrating a memory control circuit unit according to the first exemplary embodiment of the present invention.

FIG. 12 is a schematic block diagram illustrating a memory control circuit unit according to the first exemplary embodiment of the present invention. It should be understood that the structure of the memory control circuit unit illustrated in FIG. 12 is merely an example, and the invention is not limited thereto.

Referring to FIG. 12, the memory control circuit unit 104 includes a memory management circuit 202, a host interface 204, a memory interface 206 and a thermal sensor 208.

The memory management circuit 202 is configured to control the overall operation of the memory control circuit unit. To be specific, the memory management circuit 202 has a plurality of control instructions, and when the memory storage apparatus 100 is in operation, the control instructions are executed to give command sequences to the rewritable non-volatile memory module 106 for performing operations such as data writing, data reading, data erasing and so forth.

In the present exemplary embodiment, the control instructions of the memory management circuit 202 are implemented in a firmware form. For example, the memory management circuit 202 has a microprocessor unit (not shown) and a read-only memory (ROM, not shown), and the control instructions are burnt into the ROM. When the memory storage apparatus 100 is in operation, the control instructions are executed by the microprocessor unit to perform operations such as data writing, data reading, data erasing and so forth.

In another exemplary embodiment of the present invention, the control instructions of the memory management circuit 202 may also be stored as program codes in a specific area of the rewritable non-volatile memory module 106 (for example, a system area exclusively used for storing system data in a memory module). Besides, the memory management circuit 202 has a microprocessor unit (not shown), a ROM (not shown), and a RAM (not shown). In particular, the ROM has boot codes, and when the memory control circuit unit 104 is enabled, the microprocessor unit first executes the boot codes to load the control instructions from the rewritable non-volatile memory module 106 into the RAM of the memory management circuit 202. Thereafter, the microprocessor unit executes the control instructions to perform operations such as data writing, data reading, data erasing and so forth.

Further, in another exemplary embodiment of the invention, the control instructions of the memory management circuit 202 may also be implemented in a hardware form. For instance, the memory management circuit 202 includes a micro controller, a memory cell management circuit, a memory writing circuit, a memory reading circuit, a memory erasing circuit and a data processing circuit. These circuits are coupled to the micro controller. Here, the memory cell management circuit is configured to manage physical erasing units of the rewritable non-volatile memory module 106. The memory writing circuit is configured to issue a write instruction to the rewritable non-volatile memory module 106 for writing data thereto. The memory reading circuit is configured to issue a read instruction to the rewritable non-volatile memory module 106 for reading data therefrom. The memory erasing circuit is configured to issue an erase instruction to the rewritable non-volatile memory module 106 for erasing data therefrom. And, the data processing circuit is configured to process data that is about to be written to the rewritable non-volatile memory module 106 or data read from the rewritable non-volatile memory module 106.

The host interface 204 is coupled to the memory management circuit 202 and configured to receive and identify instructions and data transmitted from the host system 1000. Namely, the instructions and data transmitted from the host system 1000 are transmitted to the memory management circuit 202 through the host interface 204. In the present exemplary embodiment, the host interface 204 complies with the USB standard. However, it is should be noted that the present invention is not limited thereto, and the host interface 204 can also comply with the PATA standard, the IEEE 1394 standard, the PCI Express standard, the SD standard, the SATA standard, the UHS-I interface standard, the UHS-II interface standard, the MS standard, the MMC standard, the eMMC interface standard, the UFS interface standard, the CF standard, the IDE standard, or any other appropriate data transmission standard.

The memory interface 206 is coupled to the memory management circuit 202 and configured to access the rewritable non-volatile memory module 106. In other words, data that is about to be written to the rewritable non-volatile memory module 106 is transformed to an acceptable format for the rewritable non-volatile memory module 106 by the memory interface 206.

The thermal sensor 208 is coupled to the memory management circuit 202 and configured to detect an operating temperature of the memory storage apparatus 100.

In an exemplary embodiment of the present invention, the memory control circuit unit 104 further includes a buffer memory 252, a power management circuit 254 and an error checking and correcting circuit 256.

The buffer memory 252 is coupled to the memory management circuit 202 and configured to temporarily store the data and instructions from the host system 1000 or the data from the rewritable non-volatile memory module 106.

The power management circuit 254 is coupled to the memory management circuit 202 and configured to control the power of the memory storage apparatus 100.

The error checking and correcting circuit 256 is coupled to the memory management circuit 202 and configured to perform an error checking and correcting procedure to ensure the accuracy of data. In the present exemplary embodiment, when the memory management circuit 202 receives a write instruction from the host system 1000, the error checking and correcting circuit 256 generates an error checking and correcting code (ECC code) corresponding to data corresponding to the write instruction, and the memory management circuit 202 then writes the data corresponding to the write instruction and the corresponding ECC code to the rewritable non-volatile memory module 106. Afterwards, when reading data from the rewritable non-volatile memory module 106, the memory management circuit 202 also reads the corresponding ECC code, and the error checking and correcting circuit 256 executes an error checking and correcting procedure on the read data according to the ECC code. In particular, the error checking and correcting circuit 256 is configured as capable of correcting a number of error bits (which is referred to as a maximum number of correctable error bits hereinafter). For example, the maximum number of correctable error bits is 24. If a number of the error bits occurring in the read data is not more than 24, the error checking and correcting circuit 256 corrects the error bits back to accurate values according to the ECC code. Otherwise, the error checking and correcting circuit 256 reports a failure of error correcting, and the memory management circuit 202 transmits a message indicating that the data is lost to the host system 1000.

In the present exemplary embodiment, the memory control circuit unit 104 (or the memory management circuit 202) records a wear degree of the memory cell in the rewritable non-volatile memory module 106. For example, an erasing operation is performed on the rewritable non-volatile memory module 106 by using physical blocks as the unit. Thus, for example, the memory control circuit unit 104 (or the memory management circuit 202) records an erase count of each physical block in the rewritable non-volatile memory module 106 so as to monitor the wear degree of each memory cell. However, it should be understood, beside using the erase count as the wear degree, in another exemplary embodiment of the invention, the wear degree of the memory cell may also be evaluated according to a parameter combination partially or entirely composed of a write count, an error bit amount, an error bit ratio or a read count of the memory cell.

Specifically, in the present exemplary embodiment, the memory control circuit unit 104 (or the memory management circuit 202) determines whether the operating temperature of the memory storage apparatus 100 is larger than the predetermined temperature; and if the operating temperature of the memory storage apparatus 100 is larger than the predetermined temperature, adjusts at least one predetermined operation parameter corresponding to the rewritable non-volatile memory module to generate the adjusted operation parameter corresponding to the rewritable non-volatile memory module by adjusting the initial write voltage applied while programming according to a wear degree of a tunnel oxide layer in each memory cell, so that error bits caused by over-writing are prevented. To be specific, the memory control circuit unit 104 (or the memory management circuit 202) reduces the initial write voltage corresponding to the memory cell with the increase of the wear degree of the memory cell if the operating temperature of the memory storage apparatus 100 is larger than the predetermined temperature.

For example, when a memory cell is about to be programmed and the operating temperature of the memory storage apparatus 100 is larger than the predetermined temperature, the memory control circuit unit 104 (or the memory management circuit 202) determines whether the wear degree of the memory cell is lower than a first threshold. If the wear degree of the memory cell is lower than the first threshold, the memory control circuit unit 104 (or the memory management circuit 202) applies the first write voltage as the initial write voltage. If the wear degree of the memory cell is not lower than the first threshold, the memory control circuit unit 104 (or the memory management circuit 202) determines whether the wear degree of the memory cell is lower than a second threshold. And, if the wear degree of the memory cell is lower than the second threshold, the memory control circuit unit 104 (or the memory management circuit 202) applies the second write voltage as the initial write voltage. If the wear degree of the memory cell is not lower than the second threshold, the memory control circuit unit 104 (or the memory management circuit 202) applies a third write voltage as the initial write voltage. Here, the second threshold is higher than the first threshold, the first write voltage is higher than the second write voltage and the second write voltage is higher than the third write voltage. For example, the first threshold is 500, the second threshold is 1000, the first write voltage is 16V, the second write voltage is 14V, and the third write voltage is 12V. Namely, as shown in table 1 below, in the present exemplary embodiment, when the memory control circuit unit 104 (or the memory management circuit 202) programs the memory cell by the method of pulse writing/verifying the threshold voltage, applied voltages (i.e. an initial write voltage (Vpro_0), a first re-write voltage (Vpro_1), a second re-write voltage (Vpro_2) . . . ) vary with a wear degree of the memory cell (WD).

TABLE 1

| Memory cell | Vpro_0 | Vpro_1 | Vpro_2 | ... |
|---|---|---|---|---|
| WD < 500 | 16 V | 16.6 V | 17.2 V | ... |
| 500 <= WD < 1000 | 14 V | 14.6 V | 15.2 V | ... |
| 1000 <= WD | 12 V | 12.3 V | 13.2 V | ... |

It should be understood that in the above example, the wear degree of the memory cell is distinguished by applying two thresholds (the first threshold and the second threshold), and the initial write voltages corresponding to different wear degrees of the memory cell are set according to the first write voltage, the second write voltage and the third write voltage, but the invention is not limited thereto. In another exemplary embodiment of the present invention, the wear degree of the memory cell may be distinguished to more degrees and a write voltage of each memory cell may be calculated based on the following formula:

$$Vpgm(i,n)=IVpgm-i \times A+(n) \times C$$

Therein, i represents a wear degree of a memory cell, n is a re-program count, Ivpgm is a preset initial write voltage, C is a preset compensation value, and A is a preset adjustment value. Here, Vpgm(0, 0) represents an initial write voltage when the memory cell is worn at the lowest degree (e.g. WD<500), Vpgm(0, 1) represents a first re-write voltage when the memory cell is worn at the lowest degree (e.g. WD<500) and so on. In another exemplary embodiment, the compensation value may be correspondingly changed with different wear degrees, wherein such change may be increasing or decreasing, linearly or non-linearly. In another exemplary embodiment, the preset adjustment value may be correspondingly changed with the re-program count, wherein such change may be increasing or decreasing, linearly or non-linearly.

Figure 13:
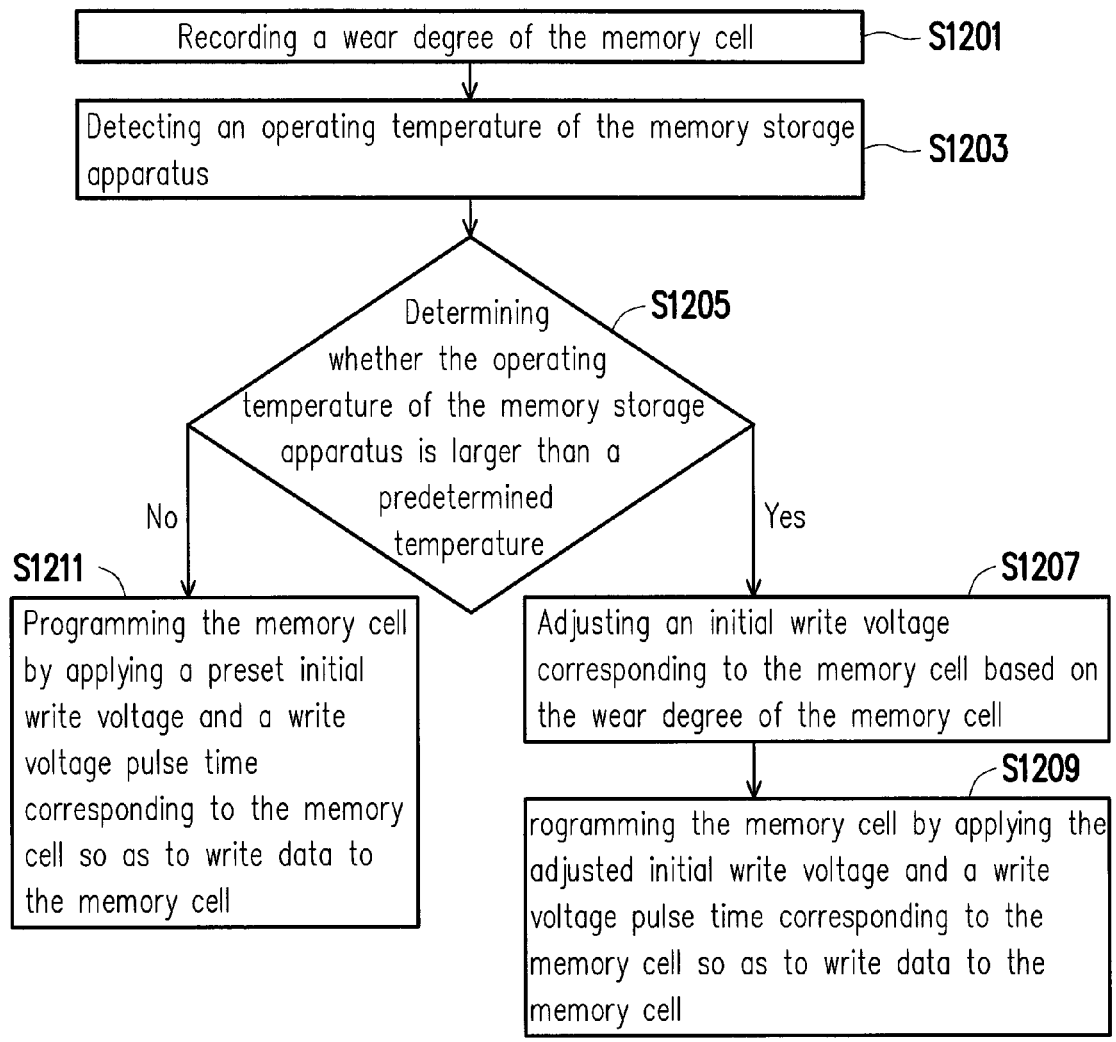
FIG. 13 is a flowchart illustrating a data writing method according to the first exemplary embodiment of the present invention.

FIG. 13 is a flowchart illustrating a data writing method according to the first exemplary embodiment of the present invention.

Referring to FIG. 13, in step S1201, a wear degree of the memory cell is recorded.

In step S1203, an operating temperature of the memory storage apparatus 100 is detected, and in step S1205, whether the operating temperature of the memory storage apparatus is larger than a predetermined temperature is determined.

If it is determined that the operating temperature of the memory storage apparatus is larger than the predetermined temperature, in step S1207, an initial write voltage corresponding to the memory cell is adjusted based on the wear degree of the memory cell.

Then, in step S1209, the memory cell is programmed by applying the adjusted initial write voltage and a write voltage pulse time corresponding to the memory cell so as to write data to the memory cell.

If it is determined that the operating temperature of the memory storage apparatus is not larger than the predetermined temperature, in step S1211, the memory cell is programmed by applying the preset initial write voltage and a write voltage pulse time corresponding to the memory cell so as to write data to the memory cell.

Figure 14:
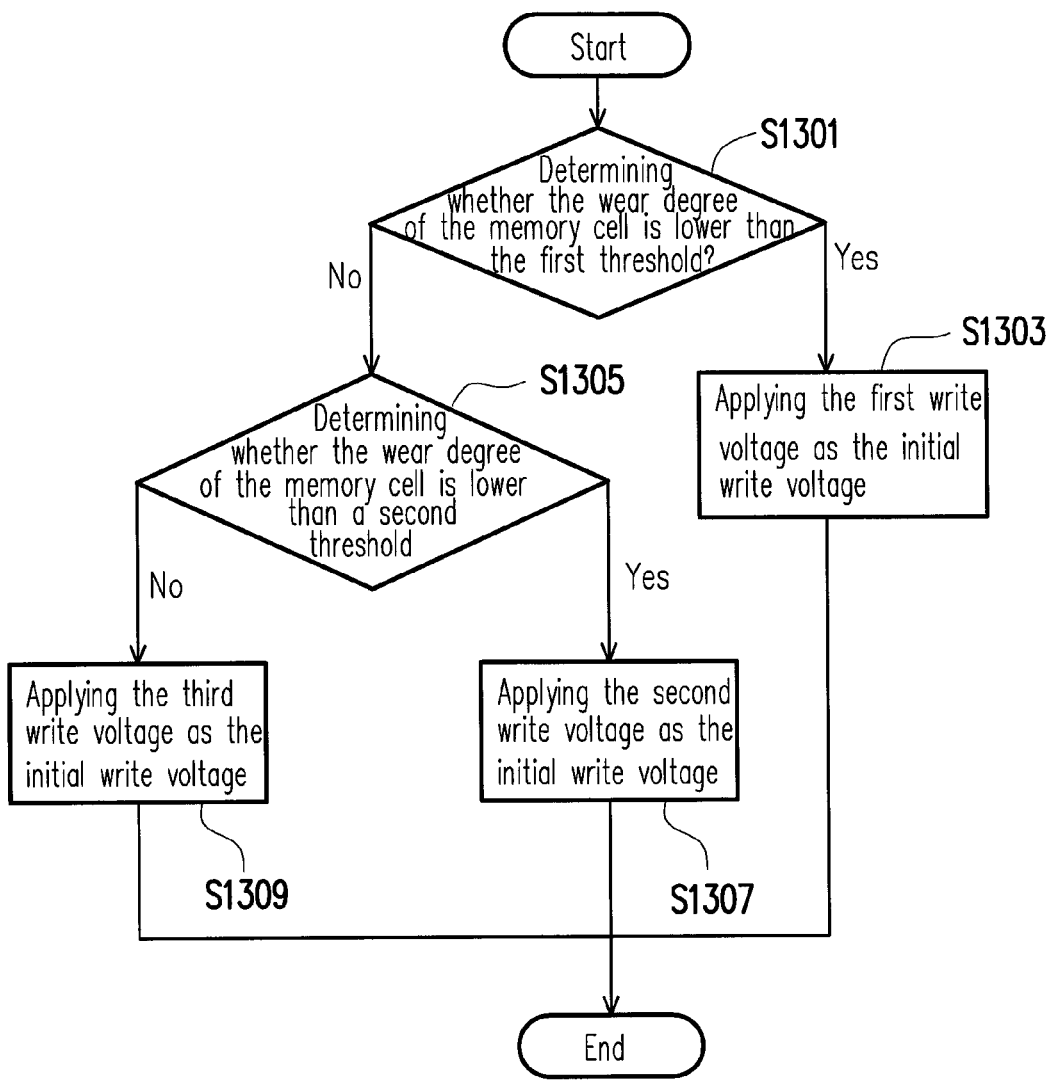
FIG. 14 is a flowchart of adjusting the initial write voltage corresponding to the memory cell according to the first exemplary embodiment of the present invention.

FIG. 14 is a flowchart of adjusting the initial write voltage corresponding to the memory cell according to the first exemplary embodiment of the invention.

Referring to FIG. 14, in step S1301, whether the wear degree of the memory cell is lower than the first threshold is determined.

If the wear degree of the memory cell is lower than the first threshold, in step S1303, the first write voltage is applied as the initial write voltage.

If the wear degree of the memory cell is not lower than the first threshold, in step S1305, whether the wear degree of the memory cell is lower than a second threshold is determined.

If the wear degree of the memory cell is lower than the second threshold, in step S1307, the second write voltage is applied as the initial write voltage.

If the wear degree of the memory cell is not lower than second threshold, in step S1309, the third write voltage is applied as the initial write voltage.

Second Exemplary Embodiment

The second exemplary embodiment illustrates a structure of a memory storage apparatus similar to the memory storage apparatus of the first exemplary embodiment, and the difference therebetween is that a memory control circuit unit (or a memory management circuit) of the second exemplary embodiment adjusts the predetermined operation parameter corresponding to the rewritable non-volatile memory module to generate the adjusted operation parameter corresponding to the rewritable non-volatile memory module by adjusting a write voltage pulse time applied during programming based on a wear degree of each memory cell, so that error bits caused by over-writing are prevented. The difference between the second exemplary embodiment and the first exemplary embodiment will be described by using the same symbols used in the first exemplary embodiment.

Typically, the memory control circuit unit 104 (or the memory management circuit 202) applies a preset time (also referred to the preset write voltage pulse time, e.g. 16 μs) as the write voltage pulse time corresponding to the memory cell of the rewritable non-volatile memory module (e.g. a flash memory module) 106. Meanwhile, during programming the memory cell, the memory control circuit unit 104 (or the memory management circuit 202) injects electrons to the memory cell by applying the write voltage pulse time operated with the initial write voltage. In present exemplary embodiment, the memory control circuit unit 104 (or the memory management circuit 202) determines whether the operating temperature of the memory storage apparatus 100 is larger than the predetermined temperature, and if the operating temperature of the memory storage apparatus 100 is larger than the predetermined temperature, reduce the write voltage pulse time corresponding to the memory cell with the increase of the wear degree of the memory cell.

Figure 15:
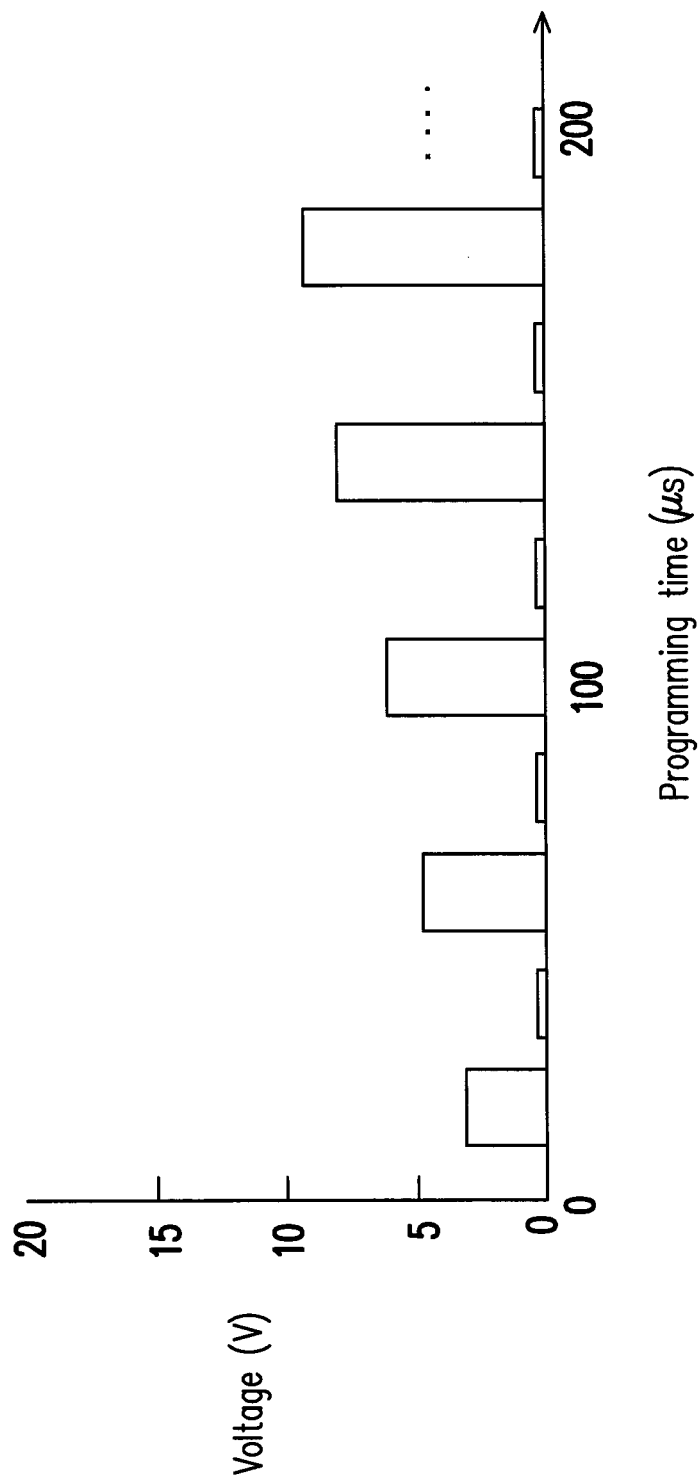
FIG. 15 through FIG. 17 are schematic diagrams of programming a memory cell according to a second exemplary embodiment of the present invention.
Figure 16:
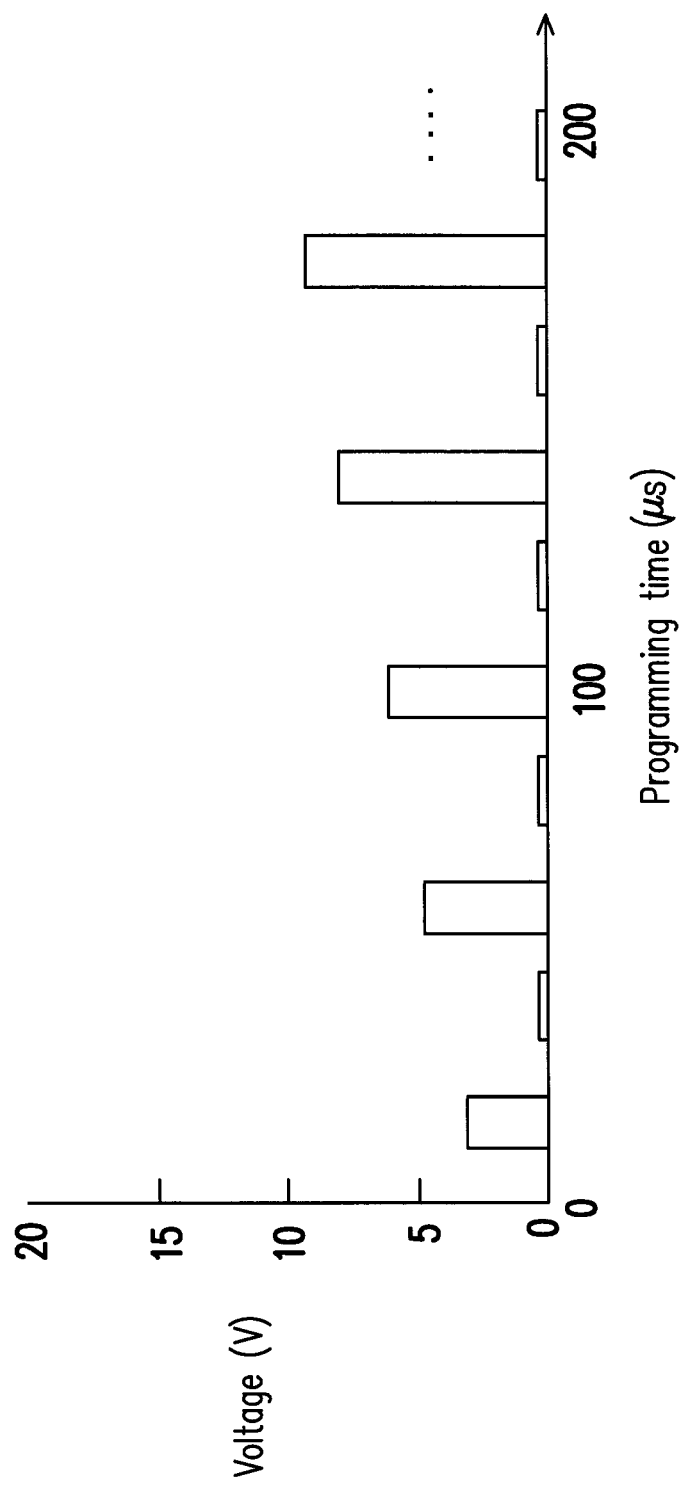
Figure 17:
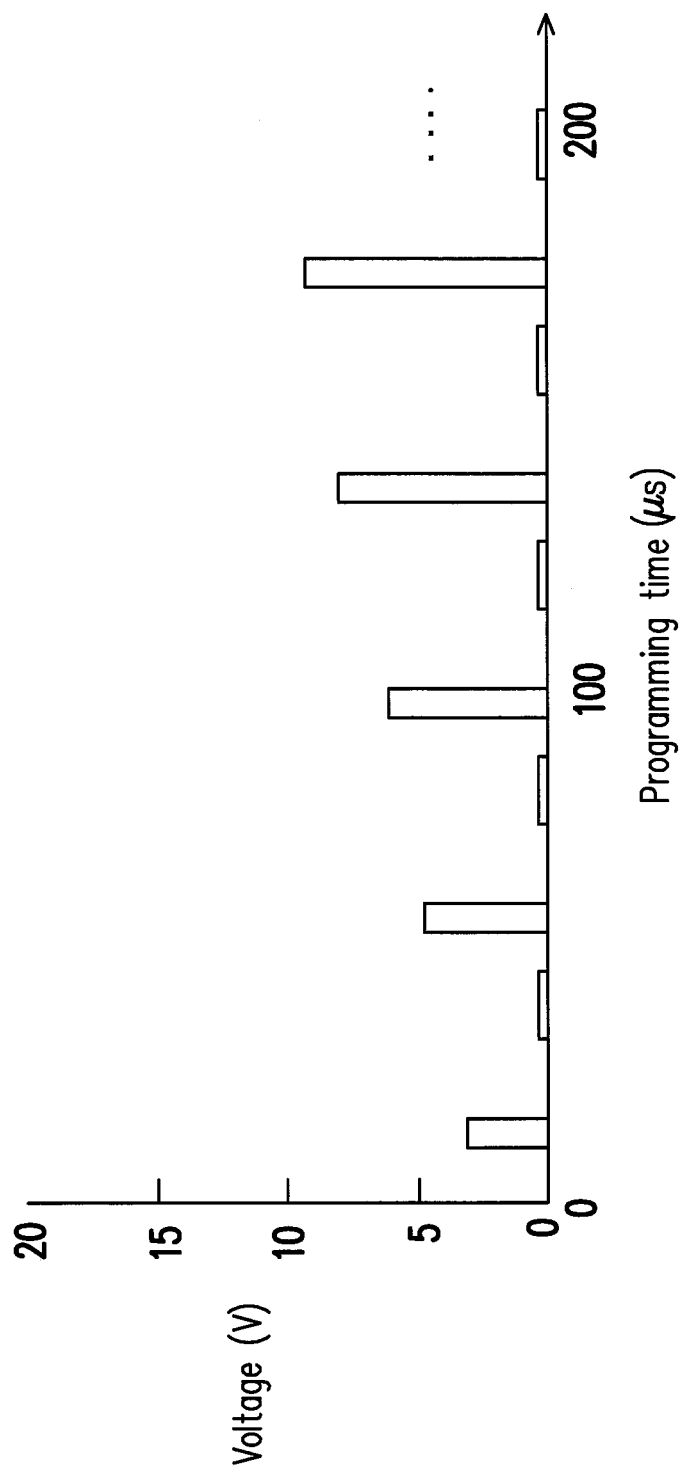

FIG. 15 through FIG. 17 are schematic diagrams of programming a memory cell according to a second exemplary embodiment of the present invention.

Referring to FIG. 15 through FIG. 17, for example, when a memory cell is about to be programmed, the memory control circuit unit 104 (or the memory management circuit 202) determines whether the wear degree of the memory cell is lower than a first threshold. If the wear degree of the memory cell is lower than the first threshold, the memory control circuit unit 104 (or the memory management circuit 202) applies a first time as the write voltage pulse time (as shown in FIG. 15). If the wear degree of the memory cell is not lower than the first threshold, the memory control circuit unit 104 (or the memory management circuit 202) determines whether the wear degree of the memory cell is lower than a second threshold. And, if the wear degree of the memory cell is lower than the second threshold, the memory control circuit unit 104 (or the memory management circuit 202) applies the second time as the write voltage pulse time (as shown in FIG. 16). If the wear degree of the memory cell is not lower than the second threshold, the memory control circuit unit 104 (or the memory management circuit 202) applies a third time as the write voltage pulse time (as shown in FIG. 17). For example, the first time is 18 μs, the second time is 14.4 μs, and the third time is 11.7 μs. That is to say, as shown in table 2 below, in the present exemplary embodiment, the memory control circuit unit 104 (or the memory management circuit 202) programs the memory cell by the method of pulse writing/verifying the threshold voltage, and the applied write voltage pulse time varies with the wear degree of the memory cell (WD).

TABLE 2

| Memory cell | Write voltage pulse time |
| --- | --- |
| WD < 500 | 18 μs |
| 500 <= WD < 1000 | 14.4 μs |
| 1000 <= WD | 11.7 μs |

In another exemplary embodiment, an initial write voltage pulse time may be correspondingly changed with different wear degrees, wherein such change may be increasing or decreasing, linearly or non-linearly. In still another exemplary embodiment, the preset adjustment value of the write voltage pulse time may be correspondingly changed with the re-program count varied, wherein such change may be increasing or decreasing, linearly or non-linearly.

Figure 18:
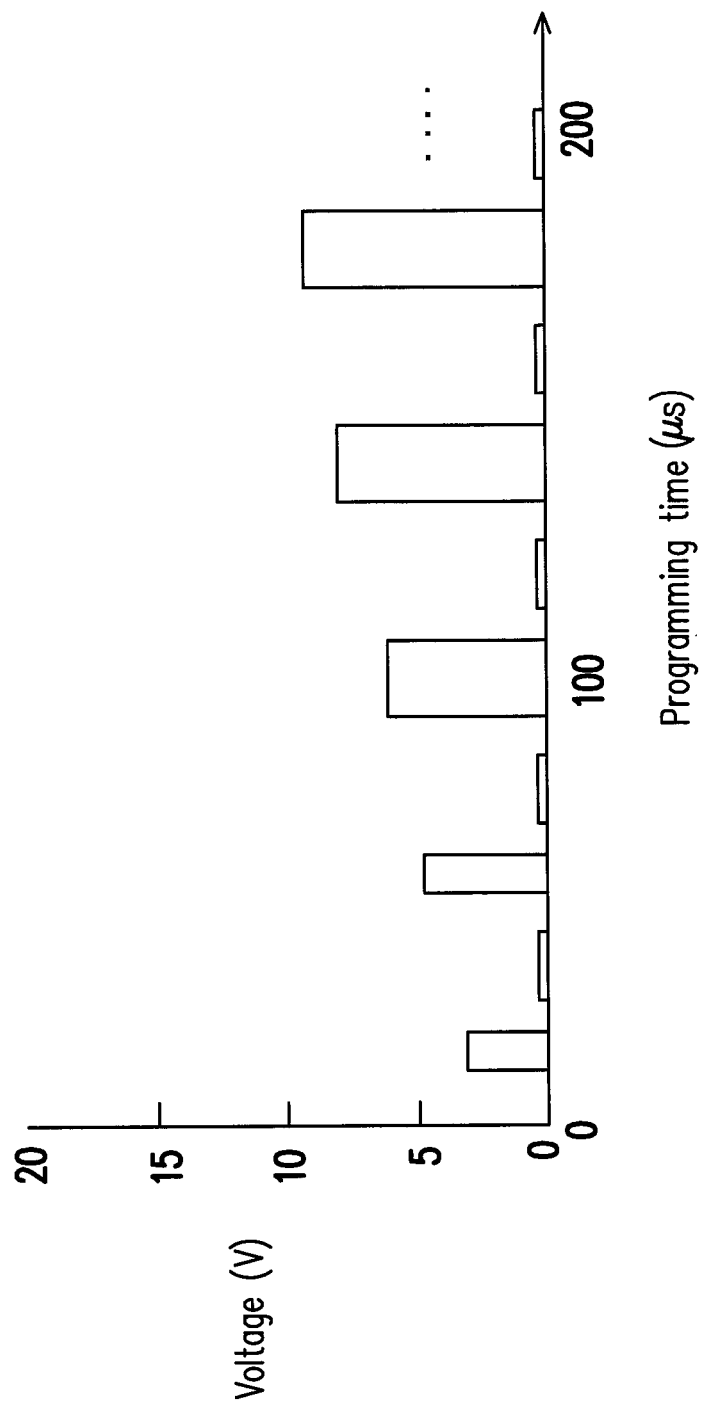
FIG. 18 is a schematic diagram of programming a memory cell according to another exemplary embodiment of the present invention.

For example, if an adjusted write voltage pulse time is determined based on the preset write voltage pulse time according to the wear degrees of the a memory cell, during a programming of a memory cell by the method of pulse writing/verifying the threshold voltage, the adjusted write voltage pulse time may be used for a first re-programming and a second re-programming, and the preset write voltage pulse time may be used for a third re-programming, a fourth re-programming and so on. That is, during a programming of a memory cell by the method of pulse writing/verifying the threshold voltage, the adjusted write voltage pulse time is applied for a portion of re-programmings and the preset write voltage pulse time is applied for another portion of re-programmings (as shown in FIG. 18).

Additionally, it is to be mentioned that in the present exemplary embodiment, when verifying through a verify voltage that the memory cell is not yet programmed to an accurate storage state, the memory control circuit unit 102 instructs the control circuit 2212 to re-program the memory cell according to a new write voltage (also referred to as a re-write voltage) and the same write voltage pulse time, wherein the new write voltage is the currently applied write voltage plus a preset compensation value. However, the invention is not limited thereto. In another embodiment of the invention, the write voltage pulse time may be increased with the increase of the re-programming frequency.

Figure 19:
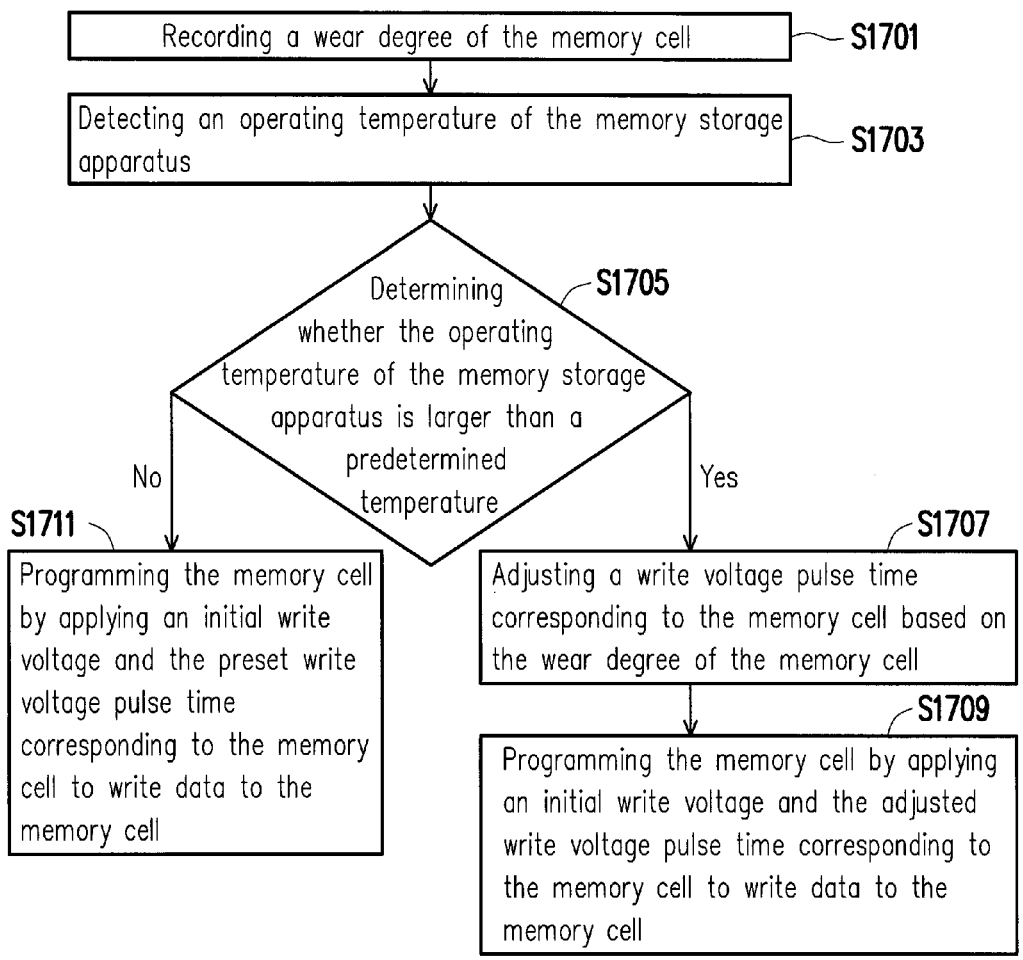
FIG. 19 is a flowchart illustrating a data writing method according to the second exemplary embodiment of the present invention.

FIG. 19 is a flowchart illustrating a data writing method according to the second exemplary embodiment of the present invention.

Referring to FIG. 19, in step S1701, a wear degree of the memory cell is recorded.

In step S1703, an operating temperature of the memory storage apparatus 100 is detected, and in step S1705, whether the operating temperature of the memory storage apparatus is larger than a predetermined temperature is determined.

If it is determined that the operating temperature of the memory storage apparatus is larger than the predetermined temperature, in step S1707, a write voltage pulse time corresponding to the memory cell is adjusted based on the wear degree of the memory cell.

In step S1709, the memory cell is programmed by applying an initial write voltage and the adjusted write voltage pulse time corresponding to the memory cell to write data to the memory cell.

If it is determined that the operating temperature of the memory storage apparatus is not larger than the predetermined temperature, in step S1711, the memory cell is programmed by applying an initial write voltage and the preset write voltage pulse time corresponding to the memory cell to write data to the memory cell.

Figure 20:
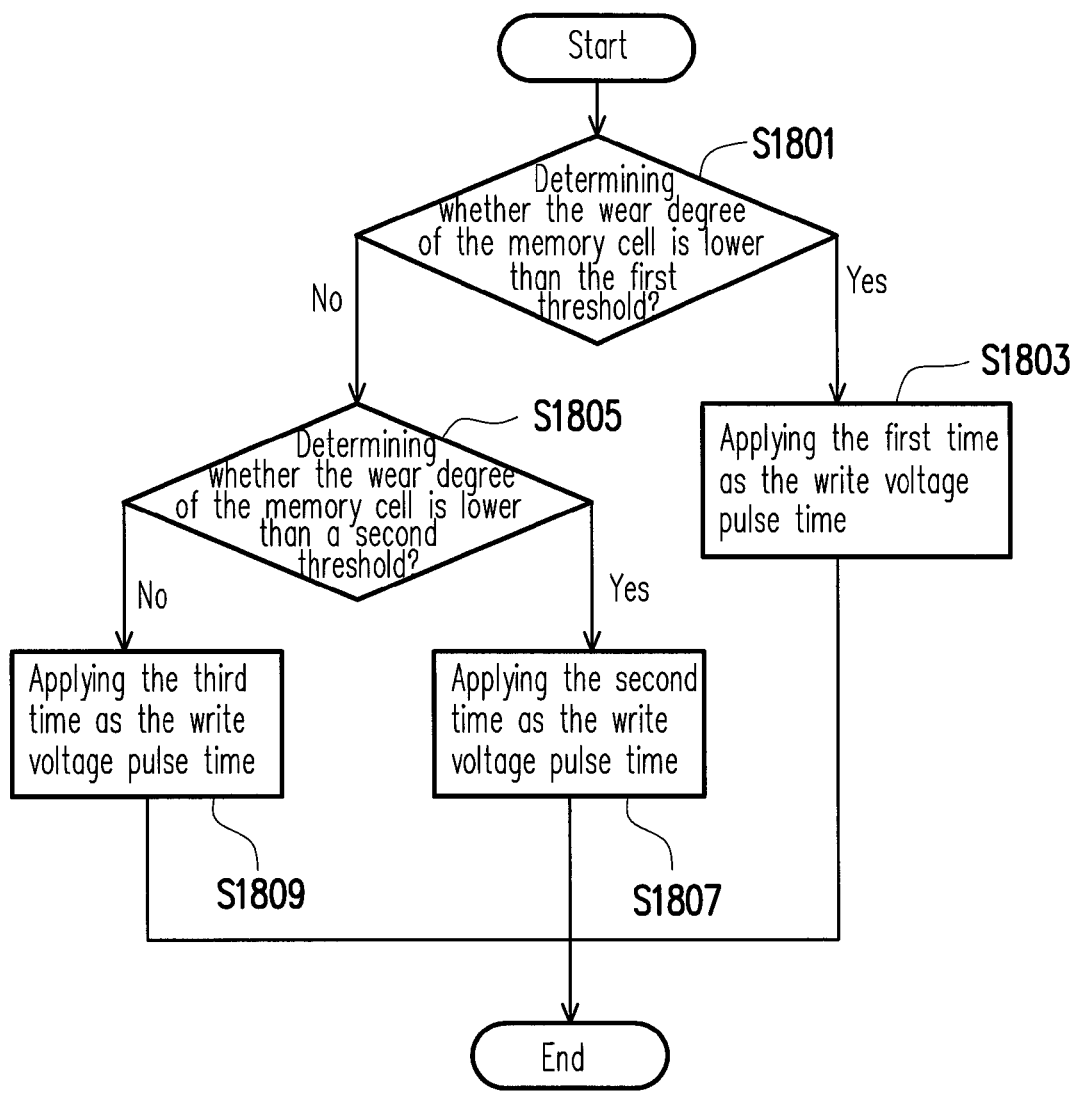
FIG. 20 is a flowchart of adjusting the write voltage pulse time corresponding to the memory cell according to the second exemplary embodiment of the present invention.

FIG. 20 is a flowchart of adjusting the write voltage pulse time corresponding to the memory cell according to the second exemplary embodiment of the present invention.

Referring to FIG. 20, in step S1801, whether the wear degree of the memory cell is lower than a first threshold is determined.

If the wear degree of the memory cell is lower than the first threshold, in step S1803, the first time is applied as the write voltage pulse time.

If the wear degree of the memory cell is not lower than the first threshold, in step S1805, whether the wear degree of the memory cell is lower than a second threshold is determined.

If the wear degree of the memory cell is lower than the second threshold, in step S1807, the second time is applied as the write voltage pulse time.

If the wear degree of the memory cell is not lower than the second threshold, in step S1809, a third time is applied as the write voltage pulse time.

It is to be mentioned that when it is determined that the operating temperature of the memory storage apparatus is larger than the predetermined temperature, the adjusting an predetermined operation parameter corresponding to the rewritable non-volatile memory module to generate an adjusted operation parameter corresponding to the rewritable non-volatile memory module may be performed by adjusting the initial write voltage applied during programming based on the wear degree of each memory cell and by adjusting the write voltage pulse time applied during programming based on the wear degree of each memory cell have been described according to the first and the second exemplary embodiments of the invention. However, in another exemplary embodiment of the present invention, the memory control circuit unit (or the memory management circuit) may also adjust both the initial write voltage and the write voltage pulse time applied during programming based on the wear degree of each memory cell, so that error bits caused by over-writing may be prevented. For example, when the wear degree of the memory cell is not lower than the first threshold but lower than the second threshold, the initial write voltage is adjusted as 90% of the original initial write voltage, and the write voltage pulse time is adjusted as 90% of the original write voltage pulse time. When the wear degree of the memory cell is not lower than the second threshold but lower than a third threshold, the initial write voltage is adjusted as 85% of the original initial write voltage, and the write voltage pulse time is adjusted as 85% of the write voltage pulse time. And, when the wear degree of the memory cell is not lower than the third threshold, the initial write voltage is adjusted as 80% of the original initial write voltage, and the write voltage pulse time is adjusted as 70% of the original write voltage pulse time.

Figure 21:
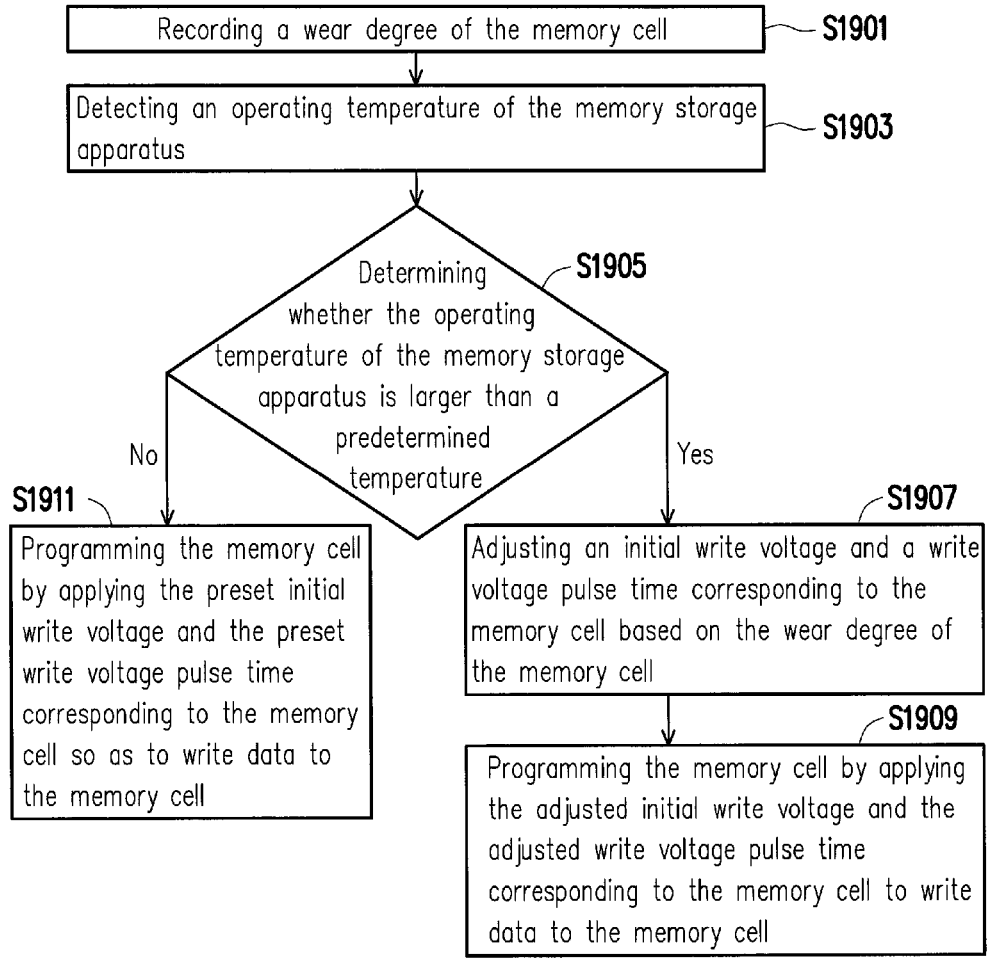
FIG. 21 is a flowchart illustrating a data writing method according to a third exemplary embodiment of the present invention.

FIG. 21 is a flowchart illustrating a data writing method according to a third exemplary embodiment of the present invention.

Referring to FIG. 21, in step S1901, a wear degree of the memory cell is recorded.

In step S1903, an operating temperature of the memory storage apparatus 100 is detected, and in step S1905, whether the operating temperature of the memory storage apparatus is larger than a predetermined temperature is determined.

If it is determined that the operating temperature of the memory storage apparatus is larger than the predetermined temperature, in step S1907, an initial write voltage and a write voltage pulse time corresponding to the memory cell is adjusted based on the wear degree of the memory cell.

Then, in step S1909, the memory cell is programmed by applying the adjusted initial write voltage and the adjusted write voltage pulse time corresponding to the memory cell to write data to the memory cell.

If it is determined that the operating temperature of the memory storage apparatus is not larger than the predetermined temperature, in step S1911, the memory cell is programmed by applying the preset initial write voltage and the preset write voltage pulse time corresponding to the memory cell so as to write data to the memory cell.

Fourth Exemplary Embodiment

The fourth exemplary embodiment illustrates a structure of a memory storage apparatus similar to the memory storage apparatus of the first exemplary embodiment, and the difference therebetween is that a memory control circuit unit (or a memory management circuit) of the second exemplary embodiment adjusts the predetermined operation parameter corresponding to the rewritable non-volatile memory module to generate the adjusted operation parameter corresponding to the rewritable non-volatile memory module by adjusting the preset compensation value applied during programming based on a wear degree of each memory cell, so that error bits caused by over-writing are prevented. The difference between the second exemplary embodiment and the first exemplary embodiment will be described by using the same symbols used in the first exemplary embodiment.

Figure 22:
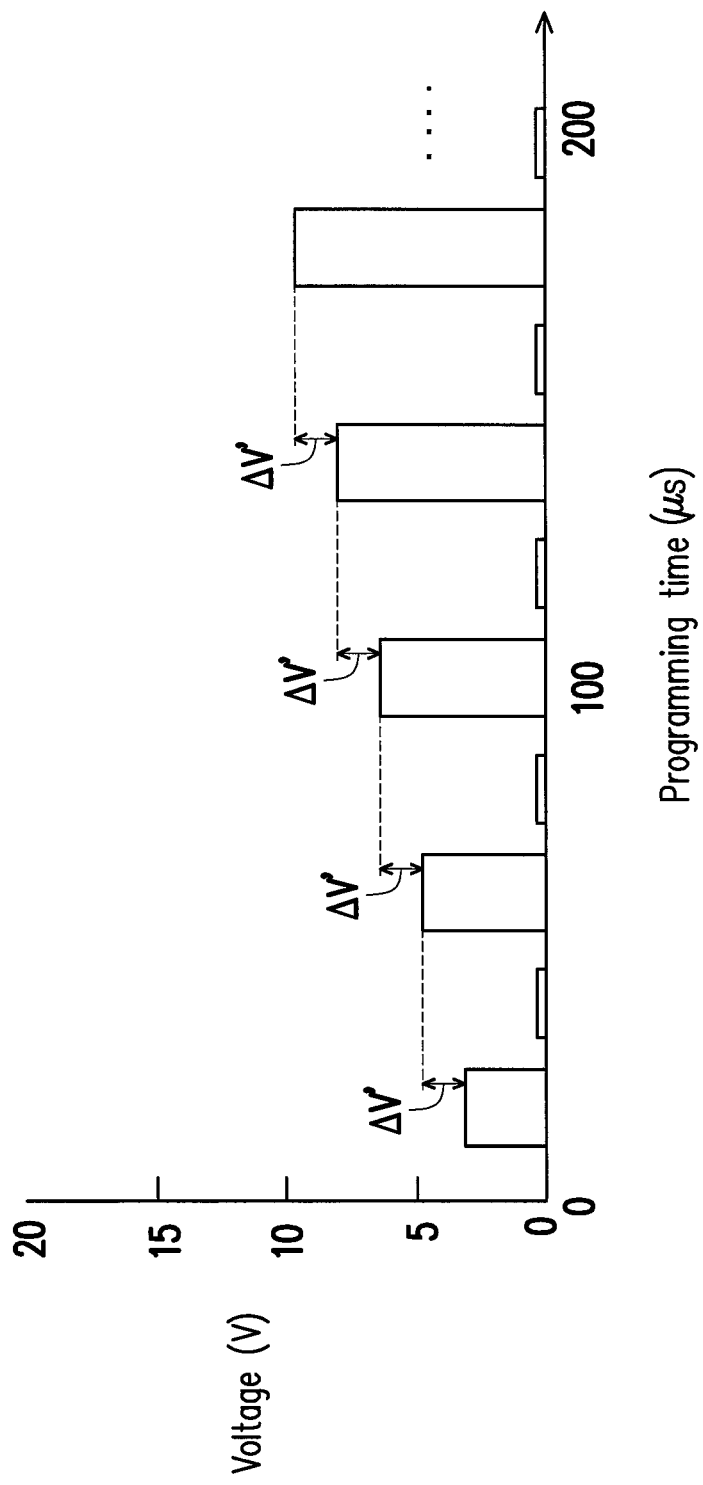
FIG. 22 is a schematic diagram of programming a memory cell according to a fourth exemplary embodiment of the present invention.

In the fourth exemplary embodiment, the memory control circuit unit 104 (or the memory management circuit 202) determines whether the operating temperature of the memory storage apparatus 100 is larger than the predetermined temperature; and if the operating temperature of the memory storage apparatus 100 is larger than the predetermined temperature, adjusts at least one predetermined operation parameter corresponding to the rewritable non-volatile memory module to generate the adjusted operation parameter corresponding to the rewritable non-volatile memory module by adjusting the preset compensation value applied while programming according to a wear degree of a tunnel oxide layer in each memory cell, so that error bits caused by over-writing are prevented. To be specific, the memory control circuit unit 104 (or the memory management circuit 202) reduces the preset compensation value (i.e., the reduced compensation value ΔV') corresponding to the memory cell with the increase of the wear degree of the memory cell if the operating temperature of the memory storage apparatus 100 is larger than the predetermined temperature (as shown in FIG. 22).

For example, when a memory cell is about to be programmed and the operating temperature of the memory storage apparatus 100 is larger than the predetermined temperature, the memory control circuit unit 104 (or the memory management circuit 202) determines whether the wear degree of the memory cell is lower than a first threshold. If the wear degree of the memory cell is lower than the first threshold, the memory control circuit unit 104 (or the memory management circuit 202) applies a first compensation value as the preset compensation value. If the wear degree of the memory cell is not lower than the first threshold, the memory control circuit unit 104 (or the memory management circuit 202) determines whether the wear degree of the memory cell is lower than a second threshold. And, if the wear degree of the memory cell is lower than the second threshold, the memory control circuit unit 104 (or the memory management circuit 202) applies the second compensation value as the preset compensation value. If the wear degree of the memory cell is not lower than the second threshold, the memory control circuit unit 104 (or the memory management circuit 202) applies a third adjustment value as the preset compensation value. Here, the second threshold is higher than the first threshold, the first compensation value is higher than the second compensation value and the second compensation value is higher than the third adjustment value. For example, the first threshold is 500, the second threshold is 1000, the first compensation value is 0.06V, the second compensation value is 0.05V, and the third compensation value is 0.04V. Namely, as shown in table 3 below, in the present exemplary embodiment, when the memory control circuit unit 104 (or the memory management circuit 202) programs the memory cell by the method of pulse writing/verifying the threshold voltage, applied voltages (i.e. an initial write voltage (Vpro_0), a first re-write voltage (Vpro_1), a second re-write voltage (Vpro_2) . . . ) vary with a wear degree of the memory cell (WD).

TABLE 3

| Memory cell | Vpro_0 | Vpro_1 | Vpro_2 | ... |
|---|---|---|---|---|
| WD < 500 | 16 V | 16.6 V | 17.2 V | ... |
| 500 <= WD < 1000 | 16 V | 16.5 V | 17.0 V | ... |
| 1000 <= WD | 16 V | 16.4 V | 16.8 V | ... |

It should be understood that in the above example, the wear degree of the memory cell is distinguished by applying two thresholds (the first threshold and the second threshold), and the preset compensation value corresponding to different wear degrees of the memory cell are set according to the first compensation value, the second compensation value and the third compensation value, but the present invention is not limited thereto. In another exemplary embodiment of the present invention, the wear degree of the memory cell may be distinguished to more degrees and a write voltage of each memory cell may be calculated based on the following formula:

$$Vpgm(i,n)=IVpgm+n \times (C - i \times A)$$

Therein, i represents a wear degree of a memory cell, n is a re-program count, Ivpgm is a preset initial write voltage, C is a preset compensation value, and A is a preset adjustment value. Here, Vpgm(0, 0) represents an initial write voltage when the memory cell is worn at the lowest degree (e.g. WD<500), Vpgm(0, 1) represents a first re-write voltage when the memory cell is worn at the lowest degree (e.g. WD<500) and so on. In another exemplary embodiment, the preset adjustment value may be correspondingly changed with different wear degrees, wherein such change may be increasing or decreasing, linearly or non-linearly.

Figure 23:
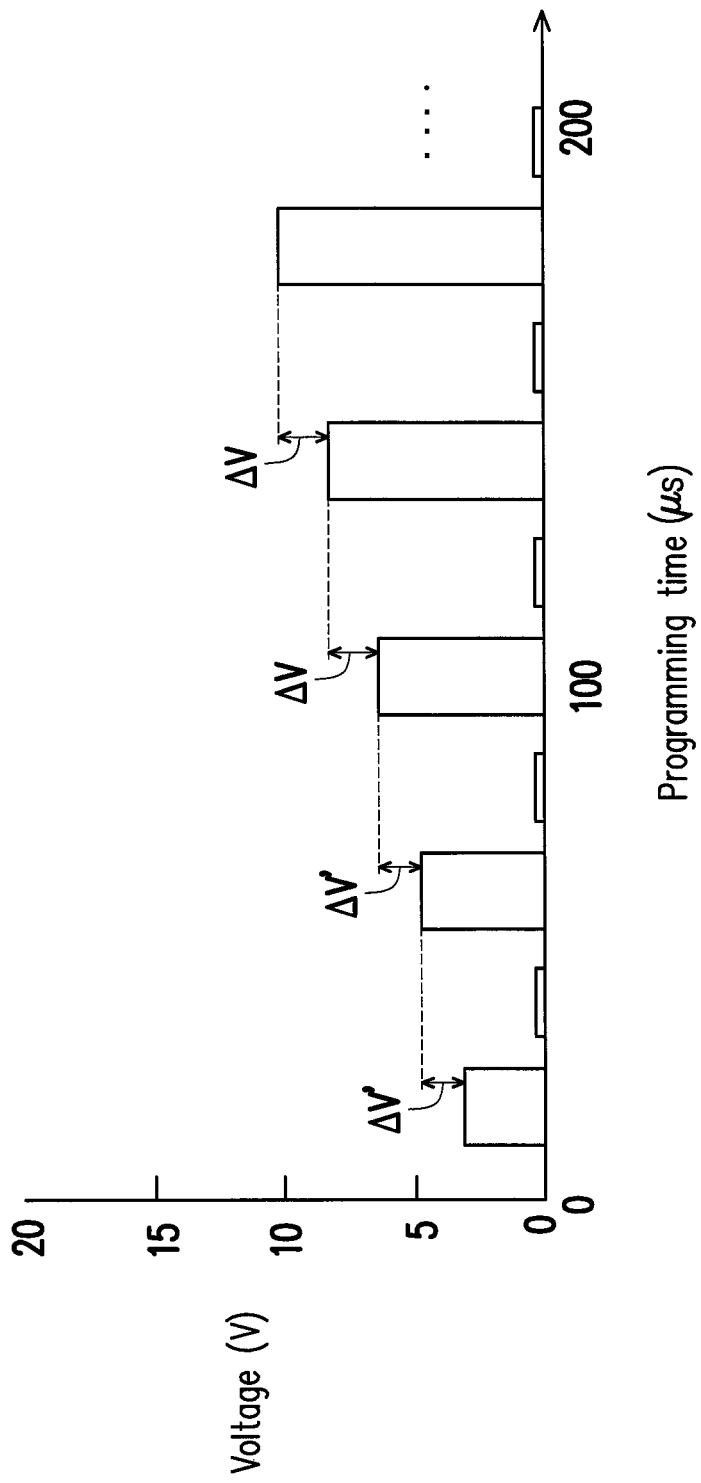
FIG. 23 is a schematic diagram of programming a memory cell according to another exemplary embodiment of the present invention.

It should be noted that in the fourth exemplary embodiment, the preset compensation value is fixed after being correspondingly determined according to the wear degrees, however, the present invention is not limited thereto. In another exemplary embodiment, during a programming of a memory cell by the method of pulse writing/verifying the threshold voltage, the preset compensation value corresponding to the cell may be changed. For example, if an adjusted compensation value is determined based on the preset adjustment value according to the wear degrees of the a memory cell, during a programming of a memory cell by the method of pulse writing/verifying the threshold voltage, the adjusted compensation value may be used for calculating a first re-write voltage and a second re-write voltage, and the preset compensation value may be used for calculating a third re-write voltage, a fourth re-write voltage and so on. That is, during a programming of a memory cell, a portion of re-write voltages are generated based on the adjusted compensation value (i.e, the reduced compensation value ΔV') and another portion of re-write voltages are generated based on the preset compensation value ΔV (as shown in FIG. 23).

Figure 24:
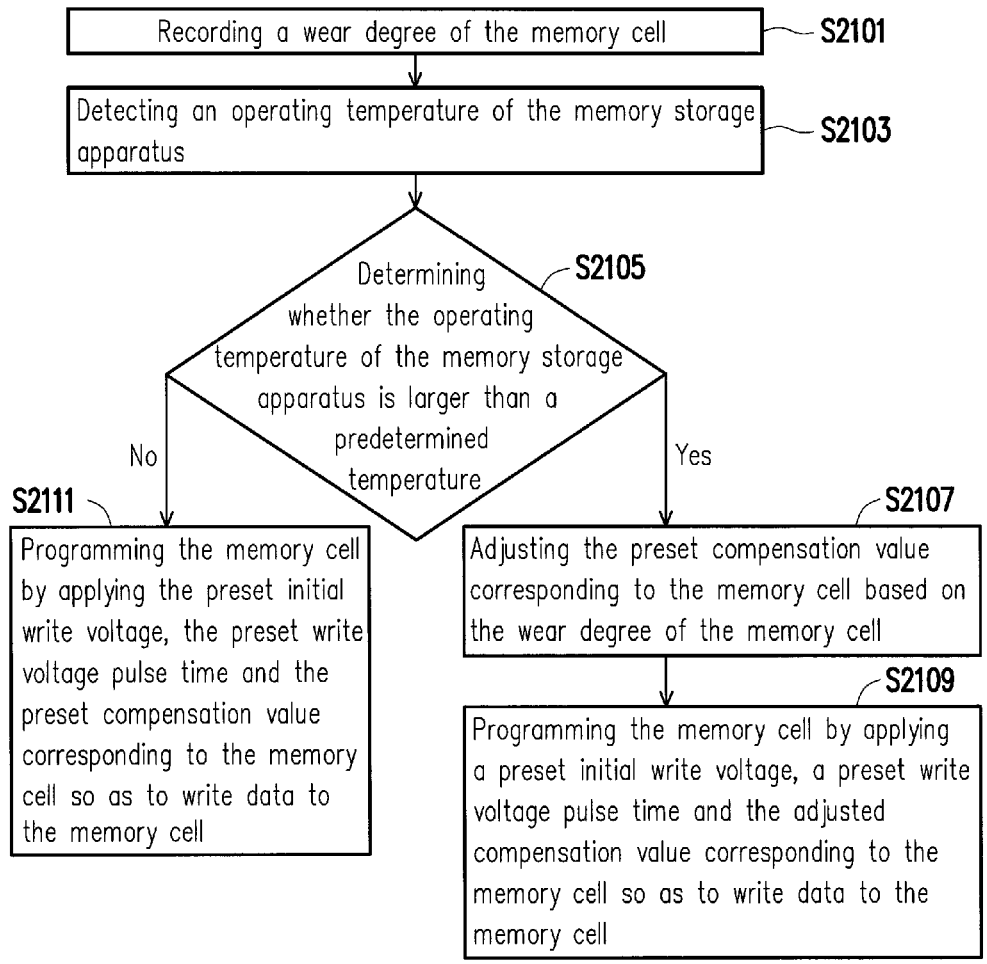
FIG. 24 is a flowchart illustrating a data writing method according to the fourth exemplary embodiment of the present invention.

FIG. 24 is a flowchart illustrating a data writing method according to the fourth exemplary embodiment of the present invention.

Referring to FIG. 24, in step S2101, a wear degree of the memory cell is recorded.

In step S2103, an operating temperature of the memory storage apparatus 100 is detected, and in step S2105, whether the operating temperature of the memory storage apparatus is larger than a predetermined temperature is determined.

If it is determined that the operating temperature of the memory storage apparatus is larger than the predetermined temperature, in step S2107, the preset compensation value corresponding to the memory cell is adjusted based on the wear degree of the memory cell.

Then, in step S2109, the memory cell is programmed by applying a preset initial write voltage, a preset write voltage pulse time and the adjusted compensation value corresponding to the memory cell so as to write data to the memory cell.

If it is determined that the operating temperature of the memory storage apparatus is not larger than the predetermined temperature, in step S2111, the memory cell is programmed by applying the preset initial write voltage, the preset write voltage pulse time and the preset compensation value corresponding to the memory cell so as to write data to the memory cell.

Figure 25:
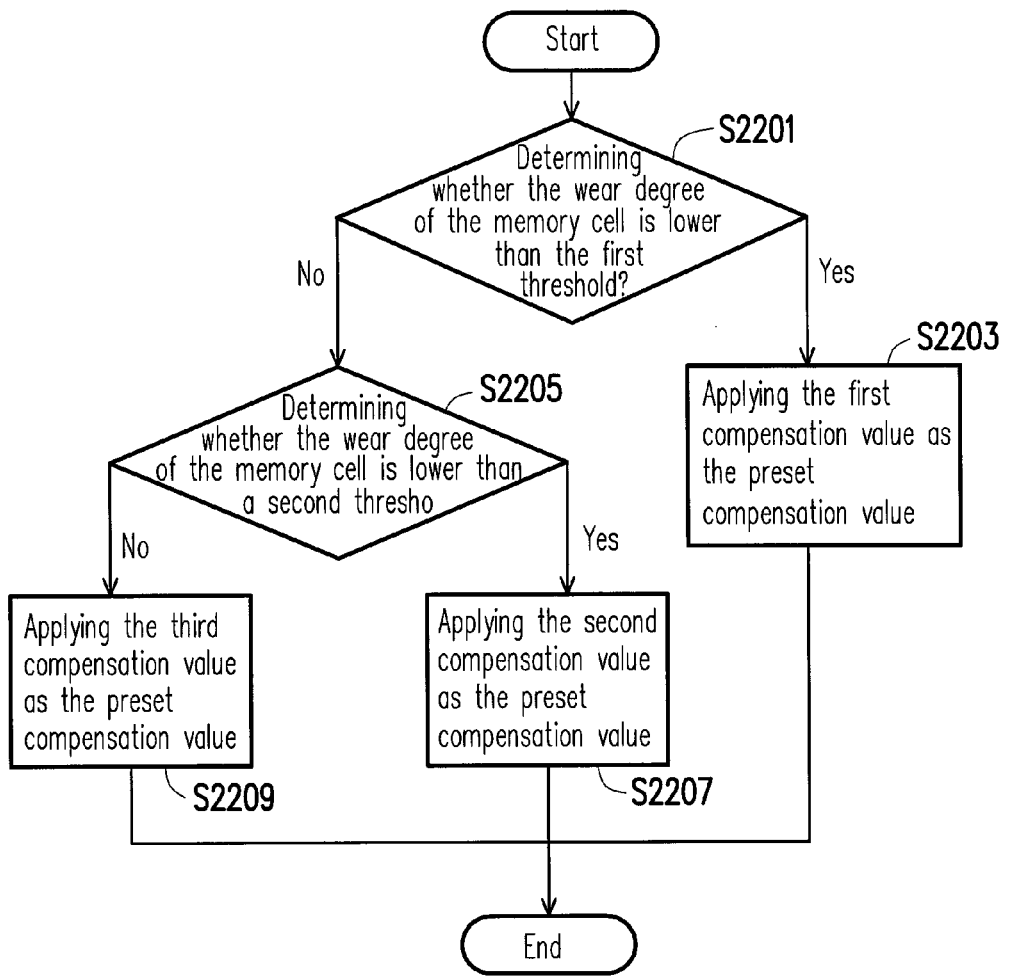
FIG. 25 is a flowchart of adjusting the compensation value corresponding to the memory cell according to the fourth exemplary embodiment of the invention.

FIG. 25 is a flowchart of adjusting the compensation value corresponding to the memory cell according to the fourth exemplary embodiment of the invention.

Referring to FIG. 25, in step S2201, whether the wear degree of the memory cell is lower than the first threshold is determined.

If the wear degree of the memory cell is lower than the first threshold, in step S2203, the first compensation value is applied as the preset compensation value.

If the wear degree of the memory cell is not lower than the first threshold, in step S2205, whether the wear degree of the memory cell is lower than a second threshold is determined.

If the wear degree of the memory cell is lower than the second threshold, in step S2207, the second compensation value is applied as the preset compensation value.

If the wear degree of the memory cell is not lower than second threshold, in step S2209, the third compensation value is applied as the preset compensation value.

Based on the above, in the data writing method, the memory control circuit unit and the memory storage apparatus according to the exemplary embodiments of the present invention, at least one predetermined operation parameter corresponding to the rewritable non-volatile memory module is adjusted based on the wear degree of the memory cell if the memory storage apparatus is at a higher temperature. Accordingly, the electrons injected to the memory cell are adjusted based on the wear degree of the memory cell every time when programming, and thus, error bits caused by over-writing can be effectively prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A data writing method for writing data into a memory cell of a rewritable non-volatile memory module of a memory storage apparatus to prevent an error bit caused by an over-writing, the data writing method comprising:

detecting an operating temperature of the memory storage apparatus;

determining whether the operating temperature of the memory storage apparatus is larger than a predetermined temperature; and adjusting at least one predetermined operation parameter corresponding to the rewritable non-volatile memory module to generate at least one adjusted operation parameter corresponding to the rewritable non-volatile memory module and writing the data into the memory cell based on the at least one adjusted operation parameter if the operating temperature of the memory storage apparatus is larger than the predetermined temperature, wherein the at least one adjusted operation parameter is configured to adjust a number of a plurality of electrons to be injected to the memory cell corresponding to the data.

2. The data writing method according to claim 1, the steps of adjusting the at least one predetermined operation parameter corresponding to the rewritable non-volatile memory module to generate the at least one adjusted operation parameter corresponding to the rewritable non-volatile memory module and writing the data into the memory cell based on the at least one adjusted operation parameter comprise:

recording a wear degree of the memory cell;

adjusting at least one of an initial write voltage, a write voltage pulse time and a compensation value corresponding to the memory cell based on the wear degree of the memory cell; and programming the memory cell by applying the initial write voltage, the write voltage pulse time and the compensation value corresponding to the memory cell to write the data to the memory cell.

3. The data writing method according to claim 2, wherein the step of adjusting at least one of the initial write voltage, the write voltage pulse time and the compensation value corresponding to the memory cell based on the wear degree of the memory cell comprises:

reducing the initial write voltage corresponding to the memory cell with the increase of the wear degree of the memory cell.

4. The data writing method according to claim 2, wherein the step of adjusting at least one of the initial write voltage, the write voltage pulse time and the compensation value corresponding to the memory cell based on the wear degree of the memory cell comprises:

reducing the write voltage pulse time corresponding to the memory cell with the increase of the wear degree of the memory cell.

5. The data writing method according to claim 4, the step of programming the memory cell by applying the initial write voltage, the write voltage pulse time and the compensation value corresponding to the memory cell to write the data to the memory cell comprises:

applying the initial write voltage, the reduced write voltage pulse time and the compensation value for at least one re-programming of the memory cell; and applying the initial write voltage, the write voltage pulse time and the compensation value for another re-programmings of the memory cell.

6. The data writing method according to claim 2, wherein the wear degree of the memory cell is determined according to at least one of an erase count, a write count, an error bit amount, an error bit ratio, and a read count.

7. The data writing method according to claim 2, wherein the step of adjusting at least one of the initial write voltage, the write voltage pulse time and the compensation value corresponding to the memory cell based on the wear degree of the memory cell comprises:
  reducing the compensation value corresponding to the memory cell with the increase of the wear degree of the memory cell.

8. The data writing method according to claim 7, the step of programming the memory cell by applying the initial write voltage, the write voltage pulse time and the compensation value corresponding to the memory cell to write the data to the memory cell comprises:
  applying the initial write voltage, the write voltage pulse time and the reduced compensation value for at least one re-programming of the memory cell; and
  applying the initial write voltage, the write voltage pulse time and the compensation value for another re-programmings of the memory cell.

9. A memory control circuit unit, for writing data to a memory cell of a rewritable non-volatile memory module of a memory storage apparatus, the memory control circuit unit comprises:
  a host interface configured to be coupled to a host system;
  a memory interface configured to be coupled to the rewritable non-volatile memory module; and
  a memory management circuit coupled to the host interface and the memory interface; and
  a thermal sensor coupled to the memory management circuit and configured to detect an operating temperature of the memory storage apparatus,
  wherein the memory management circuit is configured to determine whether the operating temperature of the memory storage apparatus is larger than a predetermined temperature,
  wherein the memory management circuit is configured to adjust at least one predetermined operation parameter corresponding to the rewritable non-volatile memory module to generate at least one adjusted operation parameter corresponding to the rewritable non-volatile memory module and give a command sequence for writing the data into the memory cell based on the at least one adjusted operation parameter to the rewritable non-volatile memory module if the operating temperature of the memory storage apparatus is larger than the predetermined temperature,
  wherein the at least one adjusted operation parameter is configured to adjust a number of a plurality of electrons to be injected to the memory cell corresponding to the data to prevent an error bit caused by an over-writing.

10. The memory control circuit unit according to claim 9, in the operation of adjusting the at least one predetermined operation parameter corresponding to the rewritable non-volatile memory module to generate the at least one adjusted operation parameter corresponding to the rewritable non-volatile memory module and give the command sequence for writing the data into the memory cell based on the at least one adjusted operation parameter to the rewritable non-volatile memory module, the memory management circuit is configured to record a wear degree of the memory cell, adjust at least one of an initial write voltage, a write voltage pulse time and a compensation value corresponding to the memory cell based on the wear degree of the memory cell and program the memory cell by applying the initial write voltage, the write voltage pulse time and the compensation value corresponding to the memory cell to write the data to the memory cell.

11. The memory control circuit unit according to claim 10, wherein in the operation of adjusting at least one of the initial write voltage, the write voltage pulse time and the compensation value corresponding to the memory cell based on the wear degree of the memory cell, the memory management circuit is configured to reduce the initial write voltage corresponding to the memory cell with the increase of the wear degree of the memory cell.

12. The memory control circuit unit according to claim 10, wherein in the operation of adjusting at least one of the initial write voltage, the write voltage pulse time and the compensation value corresponding to the memory cell based on the wear degree of the memory cell, the memory management circuit is configured to reduce the write voltage pulse time corresponding to the memory cell with the increase of the wear degree of the memory cell.

13. The memory control circuit unit according to claim 12, wherein in the operation of programming the memory cell by applying the initial write voltage, the write voltage pulse time and the compensation value corresponding to the memory cell to write the data to the memory cell, the memory management circuit applies the initial write voltage, the reduced write voltage pulse time and the compensation value for at least one re-programming of the memory cell and applies the initial write voltage, the write voltage pulse time and the compensation value for another re-programmings of the memory cell.

14. The memory control circuit unit according to claim 10, wherein the wear degree of the memory cell is determined according to at least one of an erase count, a write count, an error bit amount, an error bit ratio, and a read count.

15. The memory control circuit unit according to claim 10, wherein in the operation of adjusting at least one of the initial write voltage, the write voltage pulse time and the compensation value corresponding to the memory cell based on the wear degree of the memory cell, the memory management circuit is configured to reduce the compensation value corresponding to the memory cell with the increase of the wear degree of the memory cell.

16. The memory control circuit unit according to claim 15, in the operation of programming the memory cell by applying the initial write voltage, the write voltage pulse time and the compensation value corresponding to the memory cell to write the data to the memory cell, the memory management circuit is further configured to apply the initial write voltage, the write voltage pulse time and the reduced compensation value for at least one re-programming of the memory cell and apply the initial write voltage, the write voltage pulse time and the compensation value for another re-programmings of the memory cell.

17. A memory storage apparatus, comprising:
  a connection interface unit, configured to be coupled to a host system;
  a rewritable non-volatile memory module; and
  a memory control circuit unit, coupled to the connection interface unit and the rewritable non-volatile memory module,
  wherein the memory control circuit unit is configured to detect an operating temperature of the memory storage apparatus,
  wherein the memory control circuit unit is further configured to determine whether the operating temperature is larger than a predetermined temperature,
  wherein the memory control circuit unit is further configured to adjust at least one predetermined operation parameter corresponding to the rewritable non-volatile memory module to generate at least one adjusted operation parameter corresponding to the rewritable non-volatile memory module and give a command sequence for writing data into a memory cell of the rewritable non-volatile memory module based on the at least one adjusted operation parameter to the rewritable non-volatile memory module if the operating temperature of the memory storage apparatus is larger than the predetermined temperature, wherein the at least one adjusted operation parameter is configured to adjust a number of a plurality of electrons to be injected to the memory cell corresponding to the data to prevent an error bit caused by an over-writing.

18. The memory storage apparatus according to claim 17, in the operation of adjusting the at least one predetermined operation parameter corresponding to the rewritable non-volatile memory module to generate the at least one adjusted operation parameter corresponding to the rewritable non-volatile memory module and writing the data into the memory cell based on the at least one adjusted operation parameter, the memory control circuit unit is configured to record a wear degree of the memory cell, adjust at least one of an initial write voltage, a write voltage pulse time and a compensation value corresponding to the memory cell based on the wear degree of the memory cell and program the memory cell by applying the initial write voltage, the write voltage pulse time and the compensation value corresponding to the memory cell to write the data to the memory cell.

19. The memory storage apparatus according to claim 18, wherein in the operation of adjusting at least one of the initial write voltage, the write voltage pulse time and the compensation value corresponding to the memory cell based on the wear degree of the memory cell, the memory control circuit unit is configured to reduce the initial write voltage corresponding to the memory cell with the increase of the wear degree of the memory cell.

20. The memory storage apparatus according to claim 18, in the operation of adjusting at least one of the initial write voltage, the write voltage pulse time and the compensation value corresponding to the memory cell based on the wear degree of the memory cell, the memory control circuit unit is configured to reduce the write voltage pulse time corresponding to the memory cell with the increase of the wear degree of the memory cell.

21. The memory storage apparatus according to claim 20, wherein in the operation of programming the memory cell by applying the initial write voltage, the write voltage pulse time and the compensation value corresponding to the memory cell to write the data to the memory cell, the memory control circuit unit applies the initial write voltage, the reduced write voltage pulse time and the compensation value for at least one re-programming of the memory cell and applies the initial write voltage, the write voltage pulse time and the compensation value for another re-programmings of the memory cell.

22. The memory storage apparatus according to claim 18, wherein the wear degree of the memory cell is determined according to at least one of an erase count, a write count, an error bit amount, an error bit ratio, and a read count.

23. The memory storage apparatus according to claim 18, in the operation of adjusting at least one of the initial write voltage, the write voltage pulse time and the compensation value corresponding to the memory cell based on the wear degree of the memory cell, the memory control circuit unit is configured to reduce the compensation value corresponding to the memory cell with the increase of the wear degree of the memory cell.

24. The memory storage apparatus according to claim 23, wherein in the operation of programming the memory cell by applying the initial write voltage, the write voltage pulse time and the compensation value corresponding to the memory cell to write the data to the memory cell, the memory control circuit unit is further configured to apply the initial write voltage, the write voltage pulse time and the reduced compensation value for at least one re-programming of the memory cell and apply the initial write voltage, the write voltage pulse time and the compensation value for another re-programmings of the memory cell.

* * * * *